United States Patent
Iijima

(10) Patent No.: US 12,066,505 B2
(45) Date of Patent: Aug. 20, 2024

(54) TESTING INSTRUMENT AND TEST METHOD

(71) Applicant: HIOKI E.E. CORPORATION, Nagano (JP)

(72) Inventor: Tadashi Iijima, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 42 days.

(21) Appl. No.: 17/811,977

(22) Filed: Jul. 12, 2022

(65) Prior Publication Data

US 2023/0036325 A1 Feb. 2, 2023

(30) Foreign Application Priority Data

Jul. 21, 2021 (JP) .................................. 2021-120565
Mar. 24, 2022 (JP) .................................. 2022-048890

(51) Int. Cl.
*G01R 31/72* (2020.01)
*G01R 31/34* (2020.01)

(52) U.S. Cl.
CPC ........... *G01R 31/72* (2020.01); *G01R 31/346* (2013.01)

(58) Field of Classification Search
CPC .............................. G01R 31/72; G01R 31/346
USPC ............. 324/546–547, 765.01; 323/282–286
See application file for complete search history.

(56) References Cited

U.S. PATENT DOCUMENTS 10,107,861 B1 * 10/2018 Qi .......................... G01R 31/346
11,156,667 B2 * 10/2021 Kimura .............. G01R 31/1263

| | | | |
|---|---|---|---|
| 2014/0159754 A1 * | 6/2014 | Turner .................... | G01R 27/08 324/721 |
| 2018/0306864 A1 * | 10/2018 | Qi .......................... | G01R 31/346 |
| 2020/0158790 A1 * | 5/2020 | Kimura .............. | G01R 31/1263 |
| 2020/0355776 A1 * | 11/2020 | Lesperance ........ | G01R 31/1272 |
| 2021/0364573 A1 * | 11/2021 | Kim ....................... | H02P 21/141 |
| 2022/0056863 A1 * | 2/2022 | Ojima ................ | G01R 19/0092 |
| 2023/0036325 A1 * | 2/2023 | Iijima .................. | G01R 31/346 |

FOREIGN PATENT DOCUMENTS

| JP | 2006064515 A | * | 3/2006 |
|---|---|---|---|
| JP | 4096340 B2 | * | 6/2008 |
| JP | 2008286611 A | * | 11/2008 |
| JP | 4508211 B2 | * | 7/2010 |
| JP | 4508211 B2 | | 7/2010 |

(Continued)

*Primary Examiner* — Christopher P McAndrew
(74) *Attorney, Agent, or Firm* — Pearne & Gordon LLP

(57) ABSTRACT

The characteristics of a winding to be tested is allowed to be analyzed more easily and in a shorter time. A testing instrument 1 includes an impulse voltage application capacitor Cs having one end connected to an external terminal T2, a switch SW and a current limiting resistor Rs connected in series between another end of the impulse voltage application capacitor Cs and an external terminal T1, and a parameter calculator 5. The parameter calculator 5 calculates at least one of the value of the equivalent capacitor Cd, the value of the equivalent inductor Ld and the value of the equivalent resistor Rd by performing regression analysis using a measured value of a voltage Vcd in an analysis time period Ta from turning on of the switch SW to start of resonance based on the equivalent inductor Ld, the equivalent capacitor Cd and the equivalent resistor Rd pertaining to a winding 11.

12 Claims, 11 Drawing Sheets

(56) References Cited

FOREIGN PATENT DOCUMENTS

| JP | 4635249 B2 | * | 2/2011 | |
|---|---|---|---|---|
| JP | 2012058221 A | * | 3/2012 | |
| JP | 2012242377 A | * | 12/2012 | |
| JP | 2013024850 A | * | 2/2013 | |
| JP | 2014117153 A | * | 6/2014 | ............... G01K 7/16 |
| JP | 5721548 B2 | * | 5/2015 | |
| JP | 5721581 B2 | * | 5/2015 | |
| JP | 2023016682 A | * | 2/2023 | ........... G01R 31/346 |
| JP | 2023123087 A | * | 9/2023 | |
| KR | 20220147346 A | * | 11/2022 | |
| KR | 102544604 B1 | * | 6/2023 | |
| WO | WO-2019045044 A1 | * | 3/2019 | ......... G01R 31/1263 |

* cited by examiner

TESTING INSTRUMENT AND TEST METHOD

CROSS REFERENCE TO RELATED APPLICATIONS

This application claims the benefit of Japanese Patent Application No. 2021-120565, filed Jul. 21, 2021 and Japanese Patent Application No. 2022-048890, filed Mar. 24, 2022 and which are hereby incorporated by reference in its entirety.

BACKGROUND

Technical Field

The present disclosure relates to a testing instrument and a test method, for example, a testing instrument and a test method for measuring the characteristics of a winding of a component and a product including a coil in a rotating machine and a transformer, such as a motor and a generator.

Background

Conventionally, as a testing instrument for measuring the characteristics of windings of rotating machines, such as motors and generators, an impulse winding testing instrument has been known that calculates a multiplied value LC (LC value) of an inductance L and a capacitance C, and a multiplied value RC (RC value) of a resistance (resistance value) R and the capacitance C in an equivalent circuit that includes the winding and an internal circuit of the testing instrument, based on a variation in voltage when an impulse voltage is applied to the winding to be tested (see Japanese Patent No. 4508211).

SUMMARY

The conventional impulse winding testing instrument typified by Japanese Patent No. 4508211 can calculate the LC value and the RC value, which are the multiplied values of the parameters (the inductance L, the capacitance C, and the resistance value R) related to the winding to be tested, but cannot individually calculate each parameter. Accordingly, for example, in a case of comparing LC values or RC values between multiple windings or in a case of measuring the temporal variation of one winding, it cannot be determined which parameter among the inductance, the capacitance and the resistance value is different or temporally changes, and analysis of the characteristics of the windings is not easy.

Many of the conventional impulse winding testing instruments include a back flow preventing diode that prevents current from flowing back to the internal circuit of the impulse winding testing instrument from the winding side after an impulse voltage is applied to the winding to be tested. Such an impulse winding testing instrument calculates the LC value and the RC value using the waveform of a resonance phenomenon based on the winding to be tested, the phenomenon occurring after the impulse voltage is applied and then the internal circuit of the impulse winding testing instrument and the winding to be tested are electrically blocked from each other by the back flow preventing diode. Thus, a resonant waveform after the internal circuit of the impulse winding testing instrument and the winding to be tested are separated by the back flow preventing diode in terms of circuitry is required to be measured. Accordingly, the measurement time is long.

The present disclosure is related to providing shorter-time and easier analysis of the characteristics of a winding to be tested.

A testing instrument according to a typical embodiment includes: a first external terminal to which one terminal of a winding to be tested is connected, and a second external terminal to which another terminal of the winding is connected; an impulse voltage application capacitor having one end connected to the second external terminal; a switch connected between another end of the impulse voltage application capacitor and the first external terminal; a current limiting resistor connected between the other end of the impulse voltage application capacitor and the first external terminal in series with the switch; an instruction input interface configured to accept an instruction for starting a test; a voltage measurement circuit configured to measure a voltage between the first external terminal and the second external terminal; a memory configured to store measured value information including a measured value of the voltage measured by the voltage measurement circuit; and a parameter calculator configured to calculate at least one of a value of an equivalent inductor connected between the first external terminal and the second external terminal, a value of an equivalent capacitor connected between the first external terminal and the second external terminal, and a value of an equivalent resistor connected between the first external terminal and the second external terminal in series with the equivalent inductor, based on the measured value information stored in the memory, when the winding is equivalently represented by the equivalent inductor, the equivalent capacitor, and the equivalent resistor, wherein the instruction input interface turns on the switch according to the instruction for starting the test, and the parameter calculator calculates at least one of the value of the equivalent capacitor, the value of the equivalent inductor, and the value of the equivalent resistor, by performing regression analysis using the measured value of the voltage in a predetermined time period from turning on of the switch to start of resonance based on the equivalent inductor, the equivalent capacitor and the equivalent resistor pertaining to the winding, the measured value being in the measured value information stored in the memory.

By the testing instrument according to the present disclosure, the characteristics of a winding to be tested can be analyzed easily in shorter time.

DETAILED DESCRIPTION

Embodiments

1. Overview of Embodiments

Figure 1:
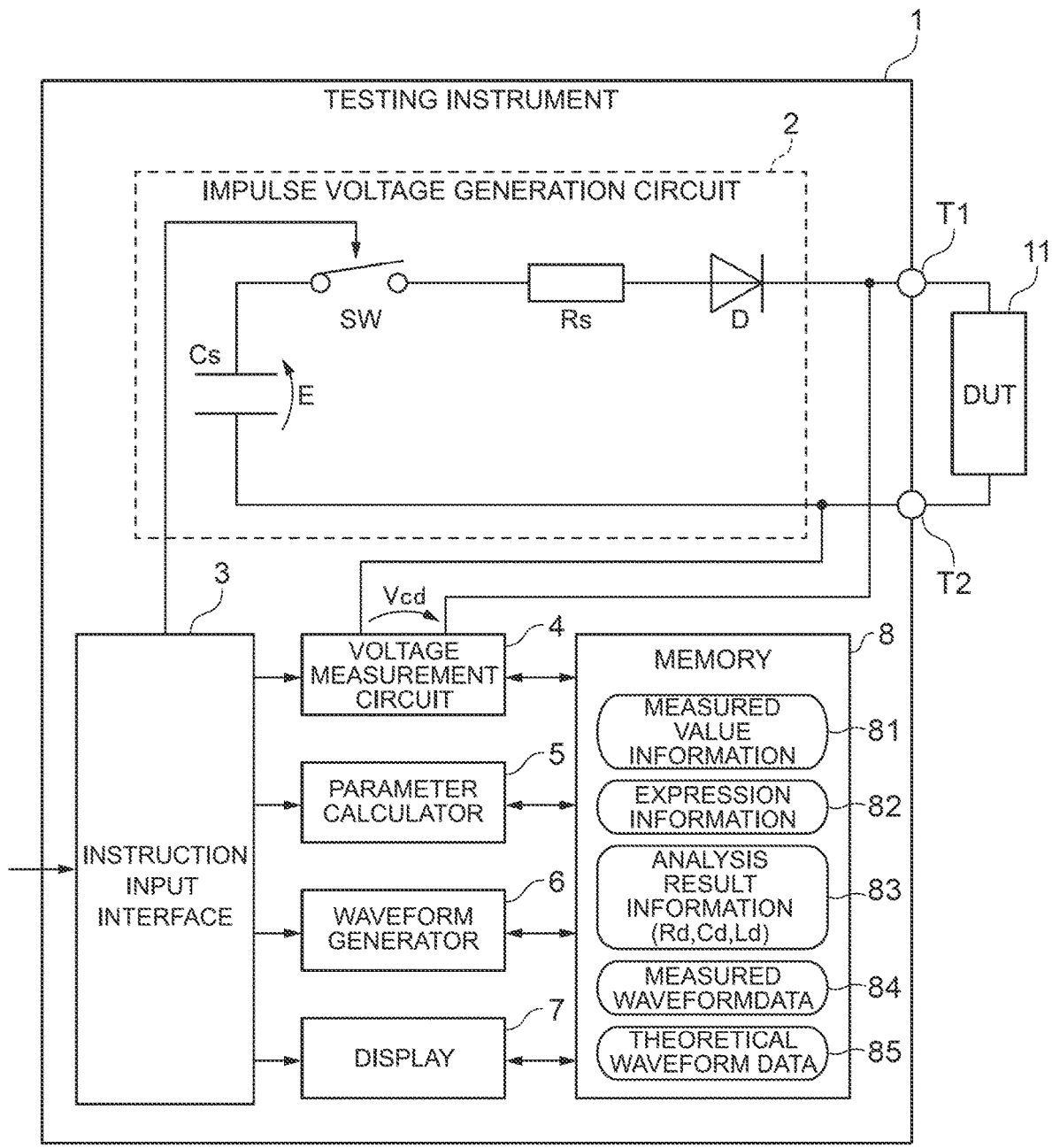
FIG. 1 is a diagram showing a configuration of a testing instrument according to Embodiment 1.

First, an overview of representative Embodiments of the disclosure disclosed in the present application is described. Note that in the following description, for example, reference signs in the drawings corresponding to the configuration elements of the disclosure are described with accompanying parentheses.

[1] A testing instrument (1, 1A, 1B) according to a typical embodiment includes: a first external terminal (T1) to which one terminal of a winding (11) to be tested is connected, and a second external terminal (T2) to which another terminal of the winding is connected; an impulse voltage application capacitor (Cs) having one end connected to the second external terminal; a switch (SW) connected between another end of the impulse voltage application capacitor and the first external terminal; a current limiting resistor (Rs) connected between the other end of the impulse voltage application capacitor and the first external terminal in series with the switch; an instruction input interface (3) configured to accept an instruction for starting a test; a voltage measurement circuit (4) configured to measure a voltage (Vcd) between the first external terminal and the second external terminal; a memory (8) configured to store measured value information (81) including a measured value of the voltage measured by the voltage measurement circuit; and a parameter calculator (5, 5A, 5B) configured to calculate at least one of a value of an equivalent inductor (Ld) connected between the first external terminal and the second external terminal, a value of an equivalent capacitor (Cd) connected between the first external terminal and the second external terminal, and a value of an equivalent resistor (Rd) connected between the first external terminal and the second external terminal in series with the equivalent inductor, based on the measured value information stored in the memory, when the winding is equivalently represented by the equivalent inductor, the equivalent capacitor, and the equivalent resistor, wherein the instruction input interface turns on the switch according to the instruction for starting the test, and the parameter calculator calculates at least one of the value of the equivalent capacitor, the value of the equivalent inductor, and the value of the equivalent resistor, by performing regression analysis using the measured value of the voltage in a predetermined time period (Ta) from turning on of the switch to start of resonance based on the equivalent inductor, the equivalent capacitor and the equivalent resistor pertaining to the winding, the measured value being in the measured value information stored in the memory.

[2] The testing instrument according to [1] may further include a rectifier element [D] configured to be connected between the other end of the impulse voltage application capacitor and the first external terminal in series with the switch and the current limiting resistor, allow current to pass from the impulse voltage application capacitor's side to the first external terminal's side, and block current from the first external terminal's side to the impulse voltage application capacitor's side.

[3] In the testing instrument according to [1] or [2], the parameter calculator may detect a maximum point (Pmax) at which the voltage is maximized after the switch is turned on, and a minimum point (Pmin) at which the voltage is minimized, and adopt a time period between the maximum point and the minimum point as the predetermined time period [Ta].

[4] In the testing instrument (1) according to any one of [1] to [3], the parameter calculator (5) may calculate coefficients of an equation of a transient response of the voltage in an equivalent circuit (20) that includes the equivalent inductor, the equivalent capacitor and the equivalent resistor, and the impulse voltage application capacitor and the current limiting resistor, by performing regression analysis using the measured value of the voltage in the predetermined time period, and calculates the value of the equivalent capacitor, the value of the equivalent inductor, and the value of the equivalent resistor, based on the calculated coefficients.

[5] In the testing instrument (1) according to [4], the equation of the transient response may be an expression obtained by integrating a differential equation representing a temporal variation in the voltage in the equivalent circuit, multiple times with respect to time.

[6] In the testing instrument according to [5], the equation of the transient response may be an expression obtained by integrating the differential equation three times with respect to time, and provided that the value of the equivalent inductor is Ld, the value of the equivalent capacitor is Cd, the value of the equivalent resistor is Rd, a value of the impulse voltage application capacitor is Cs, a value of the current limiting resistor is Rs, the voltage between the first external terminal and the second external terminal is Vcd, and the time is t, the expression obtained by three time integrations may be represented by a following expression (2).

[7] In the testing instrument according to [5], the equation of the transient response may be an expression obtained by integrating the differential equation twice with respect to time, and provided that the value of the equivalent inductor is Ld, the value of the equivalent capacitor is Cd, the value of the equivalent resistor is Rd, a value of the impulse voltage application capacitor is Cs, a value of the current limiting resistor is Rs, the voltage between the first external terminal and the second external terminal is Vcd, and the time is t, the expression obtained by two time integrations may be represented by a following expression (11).

[8] The testing instrument (1) according to any one of [4] to [7] may further include a waveform generator (6) configured to generate a theoretical waveform (310) of the voltage by performing numerical integration using the equation of the transient response to which the value of the equivalent capacitor, the value of the equivalent inductor and the value of the equivalent resistor calculated by the parameter calculator have been applied, and a display (7) configured to display the theoretical waveform generated by the waveform generator and the measured waveform (300) of the voltage measured by the voltage measurement circuit.

[9] In the testing instrument (1A, 1B) according to [1] or [2], the parameter calculator (5A, 5B) may calculate the value of the equivalent capacitor, based on an equation indicating a relationship between the impulse voltage application capacitor and the equivalent capacitor and on the measured value information stored in the memory, the equation assuming that an initial value ($Vcd|_{t=0}$) of the voltage in the predetermined time period coincides with a voltage obtained by dividing a charge voltage (Vcs) of the impulse voltage application capacitor between the impulse voltage application capacitor (Cs) and the equivalent capacitor (Cd), and the parameter calculator may calculate coefficients of an equation of a transient response of the voltage in an equivalent circuit (22) that includes the equivalent inductor and the equivalent resistor, and the impulse voltage application capacitor and the current limiting resistor, by performing regression analysis using the measured value of the voltage in the predetermined time period, and calculate the value of the equivalent inductor and the value of the equivalent resistor, based on the calculated coefficients and on the initial value of the voltage.

[10] The testing instrument (1B) according to [9] may further include: a waveform generator (6) configured to generate a theoretical waveform of the voltage by performing numerical integration using the equation of the transient response to which the value of the equivalent capacitor, the value of the equivalent inductor and the value of the equivalent resistor calculated by the parameter calculator (5B) have been applied; and an error calculator (9) configured to calculate an error between the theoretical waveform generated by the waveform generator and the measured waveform of the voltage measured by the voltage measurement circuit, wherein the parameter calculator may adopt the value of the equivalent capacitor, the value of the equivalent inductor and the value of the equivalent resistor that minimize the error, as analysis results of the winding.

[11] In the testing instrument according to [9] or [10], the equation of the transient response may be an expression obtained by integrating a differential equation representing a temporal variation in the voltage in the equivalent circuit, with respect to time.

[12] In the testing instrument according to [11], provided that the value of the equivalent inductor is Ld, the value of the equivalent capacitor is Cd, the value of the equivalent resistor is Rd, a value of the impulse voltage application capacitor is Cs, a value of the current limiting resistor is Rs, the voltage between the first external terminal and the second external terminal is Vcd, and the time is t, the equation of the transient response may be an expression that is obtained by integrating the differential equation from time t=0 to time t=a (a>0) and is represented by a following expression (21) or (22).

[13] A method according to a typical embodiment is a test method using a testing instrument (1) including: a first external terminal (T1) to which one terminal of a winding (11) to be tested is connected, and a second external terminal (T2) to which another terminal of the winding is connected; an impulse voltage application capacitor (Cs) having one end connected to the second external terminal; a switch (SW) connected between another end of the impulse voltage application capacitor and the first external terminal; and a current limiting resistor (Rs) connected between the other end of the impulse voltage application capacitor and the first external terminal in series with the switch. The test method includes: a first step (S4) of turning on the switch; a second step (S5) of measuring a voltage between the first external terminal and the second external terminal; and a third step (S5 to S7, S7A, S8A) of calculating a value of an equivalent inductor (Ld) connected between the first external terminal and the second external terminal, a value of an equivalent capacitor (Cd) connected between the first external terminal and the second external terminal, and a value of an equivalent resistor (Rd) connected between the first external terminal and the second external terminal in series with the equivalent inductor, based on the measured value of the voltage measured in the second step, when the winding is equivalently represented by the equivalent inductor, the equivalent capacitor, and the equivalent resistor. The third step includes a step (S6, S7, S7A, S8A) of calculating at least one of the value of the equivalent inductor, the value of the equivalent capacitor, and the value of the equivalent resistor, by performing regression analysis using the measured value of the voltage in a predetermined time period (Ta) from turning on of the switch to start of resonance based on the inductor, the capacitor and the resistor pertaining to the winding.

2. Specific Examples of Embodiments

Hereinafter, specific examples of the embodiments of the present disclosure are described with reference to the drawings. Note that in the following description, configuration elements common to the embodiments are assigned the same reference signs, and redundant description is omitted.

Embodiment 1

FIG. 1 is a diagram showing a configuration of a testing instrument 1 according to Embodiment 1.

The testing instrument 1 shown in FIG. 1 is a device that measures the characteristics of a winding (coil) forming an electric device, such as a rotating machine or a transformer, of a motor, a generator, etc. For example, the testing instrument 1 is an impulse winding testing instrument that calculates at least one of values of an equivalent inductor, an equivalent capacitor and an equivalent resistor that are parameters related to the winding to be tested, based on the variation in voltage when an impulse voltage is applied to a winding to be tested.

As shown in FIG. 1, the testing instrument 1 includes external terminals T1 and T2, an impulse voltage generation circuit 2, an instruction input interface 3, a voltage measurement circuit 4, a parameter calculator 5, a waveform generator 6, a display 7, and a memory 8.

The external terminals T1 and T2 are terminals to which a winding 11 as a device under test (DUT) is connected. For example, one terminal of the winding 11 is connected to the external terminal T1, and another terminal of the winding 11 is connected to the external terminal T2.

The impulse voltage generation circuit 2 is a circuit for applying a desired impulse voltage to the winding 11 to be tested that is connected between the external terminals T1 and T2. The impulse voltage generation circuit 2 includes, for example, an impulse voltage application capacitor Cs, a switch SW, and a current limiting resistor Rs.

The impulse voltage application capacitor Cs is a capacitor that accumulates electrical charges for causing an impulse voltage E. One end of the impulse voltage application capacitor Cs is connected to the external terminal T2.

The switch SW is an element for switching whether to allow the impulse voltage E to be output or not. The switch SW is achieved by a semiconductor element, such as a power transistor or a thyristor, for example. The switch SW is connected between another end of the impulse voltage application capacitor Cs and the external terminal T1.

The current limiting resistor Rs is an element for limiting current flowing from the external terminal T1 to the winding 11 to be tested when the impulse voltage application capacitor Cs is discharged. The current limiting resistor Rs is connected between the other end of the impulse voltage application capacitor Cs and the external terminal T1 in series with the switch SW.

A rectifier element D allows current to pass from the impulse voltage application capacitor Cs side to the external terminal T1 side, while blocking current from the external terminal T1 side to the impulse voltage application capacitor Cs side. The rectifier element D is, for example, a diode. Note that in the following description, the rectifier element D is also represented as "back flow preventing diode D".

The back flow preventing diode D is connected between the other end of the impulse voltage application capacitor Cs and the external terminal T1, in series with the switch SW and the current limiting resistor Rs. For example, an anode electrode of the back flow preventing diode D is connected to one end of the current limiting resistor Rs, and a cathode electrode of the back flow preventing diode D is connected to the external terminal T1.

The impulse voltage generation circuit 2 outputs the impulse voltage E via the switch SW between the one end of the current limiting resistor Rs and the external terminal T2 according to an instruction from the instruction input interface 3.

For example, first, the impulse voltage application capacitor Cs is charged by a direct-current power source, not shown, so that the voltage of the impulse voltage application capacitor Cs can be the impulse voltage E. Thereafter, according to an instruction from the instruction input interface 3, the switch SW is turned on. Accordingly, electrical charges stored in the impulse voltage application capacitor Cs are discharged through the current limiting resistor Rs and the back flow preventing diode D, and a voltage Vcd occurs between the external terminals T1 and T2.

The instruction input interface 3 is a functional unit that accepts an instruction for the testing instrument 1. The instruction input interface 3 is achieved by, for example, operation buttons that accept an operation by a user to the testing instrument 1, an input interface device, such as a touch panel, and a program process by a CPU. When test conditions, such as the value of the impulse voltage E and an after-mentioned sampling frequency, are input by the user, the instruction input interface 3 stores the input values in the memory 8, thus setting the test conditions in the testing instrument 1. The instruction input interface 3 turns on the switch SW of the impulse voltage generation circuit 2 according to an input of an instruction for starting a test by the user.

The voltage measurement circuit 4 is a functional unit that measures the voltage (inter-terminal voltage) Vcd between the external terminal T1 and the external terminal T2. The voltage measurement circuit 4 stores, in the memory 8, measured value information 81 that includes measured values of the voltage Vcd.

Specifically, the voltage measurement circuit 4 obtains a measured value of the voltage Vcd by sampling the voltage Vcd at a predetermined sampling period. For example, the voltage measurement circuit 4 includes a resistance voltage divider circuit that divides the voltage Vcd between the external terminal T1 and the external terminal T2, and an A/D conversion circuit that converts the voltage divided by the resistance voltage divider circuit into a digital signal at the predetermined sampling period. For example, the voltage measurement circuit 4 obtains time-series data on measured values (sampled data) of the voltage Vcd by sampling the voltage Vcd at the predetermined sampling period, and stores the data as the measured value information 81 in the memory 8.

The parameter calculator 5 is a functional unit that calculates the values of the equivalent capacitor, the equivalent inductor and the equivalent resistor as parameters pertaining to the winding 11 to be tested. The waveform generator 6 is a functional unit that generates data on various waveforms indicating the characteristics of the voltage, current and the like pertaining to the winding 11 to be tested. Note that the detailed functions of the parameter calculator 5 and the waveform generator 6 are described later.

The memory 8 is a functional unit for storing a program and various parameters allowing the testing instrument 1 to function as an impulse winding testing instrument, test results of the winding 11 to be tested and the like. For example, in the memory 8, not only the measured value information 81 described above, but also expression information 82, analysis result information 83, measured waveform data 84, and theoretical waveform data 85 and the like, which are described later, are stored.

The parameter calculator 5, the waveform generator 6 and the memory 8 described above are achieved by a program processing device, for example. Specifically, in a program processing device (e.g., a microcontroller) having a configuration that includes a processor, such as a CPU, various memory devices, such as RAMs and ROMs, and peripheral circuits, such as a counter (timer), an A/D conversion circuit, a D/A conversion circuit, a clock generation circuit, and an input and output I/F circuit, which are connected to each other via a bus and dedicated lines, the processor executes various operation processes according to a program stored in the memory, and controls the peripheral circuits, such as the A/D conversion circuit and the input and output I/F circuit, based on the processing result, thus achieving the functional blocks described above.

The display 7 is a functional unit that displays information for setting the test conditions, information on the test result and the like. The display 7 is achieved by a display device, such as a liquid crystal display, for example.

For analysis of the characteristics of the winding 11 to be tested, the testing instrument 1 calculates at least one of the values of the equivalent inductor, the equivalent capacitor and the equivalent resistor, which are the parameters pertaining to the winding 11, based on the transient response characteristics of the voltage Vcd between the external terminals T1 and T2 when an impulse voltage E is applied to the winding 11 connected between the external terminals T1 and T2.

Hereinafter, a specific method of calculating each parameter pertaining to the winding 11 to be tested by the testing instrument 1 is described.

Figure 2:
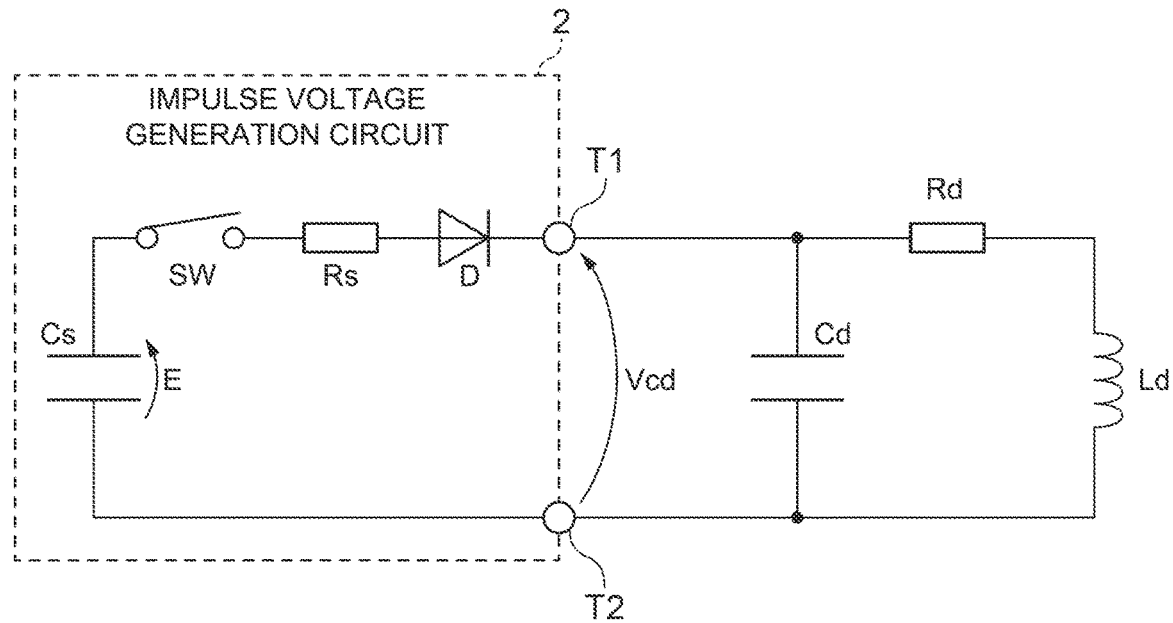
FIG. 2 is a diagram showing an equivalent circuit in a case where a winding to be tested is connected to the testing instrument according to Embodiment 1.

FIG. 2 is a diagram showing an equivalent circuit in a case where the winding 11 to be tested is connected to the testing instrument 1 according to Embodiment 1.

Figure 3:
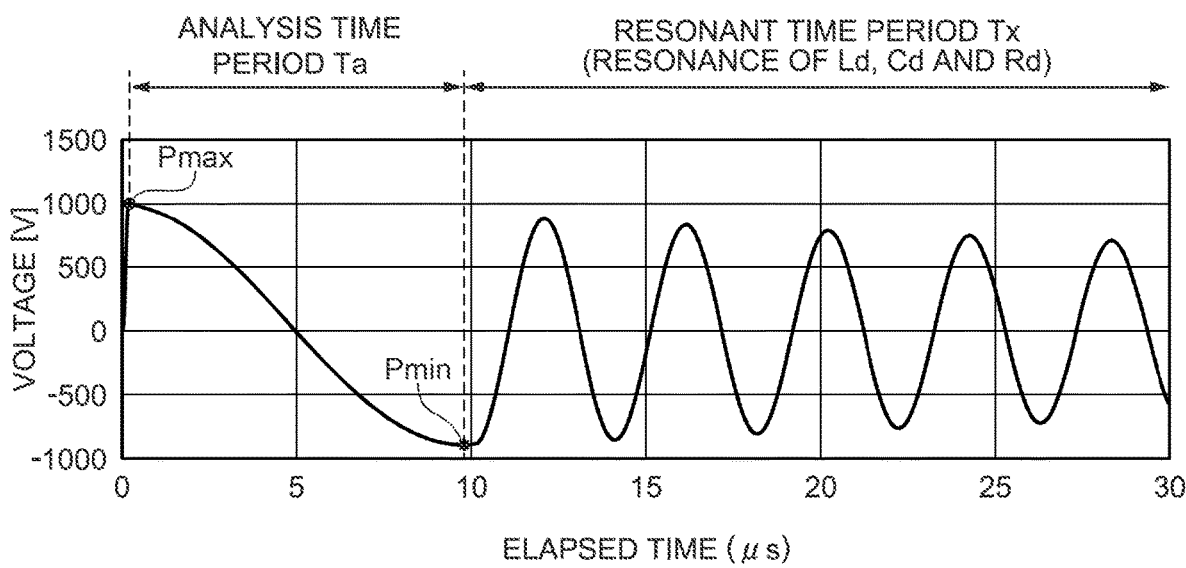
FIG. 3 is a diagram showing an example of the characteristics of the voltage Vcd across the opposite ends of a winding when an impulse voltage is applied to the opposite external terminals in a state where the winding is connected to the testing instrument according to Embodiment 1.

FIG. 3 is a diagram showing an example of the characteristics of the voltage Vcd across the opposite ends of a winding 11 when an impulse voltage is applied between the external terminals T1 and T2 in a state where the winding 11 is connected to the testing instrument 1 according to Embodiment 1.

In FIG. 3, the abscissa axis represents the elapsed time [μs], and the ordinate axis represents the voltage [V]. In FIG. 3, a temporal variation in voltage Vcd after an impulse voltage application capacitor is charged so that the impulse voltage E can be 1,000 V and then the switch SW is turned on is shown.

As shown in FIG. 2, the circuit viewed from the external terminals T1 and T2 toward the winding 11 is equivalently represented by the equivalent inductor Ld connected between the external terminals T1 and T2, the equivalent capacitor Cd connected between the external terminals T1 and T2, and the equivalent resistor Rd connected between the external terminals T1 and T2 in series with the equivalent inductor Ld.

As shown in FIG. 3, when the switch SW of the impulse voltage generation circuit 2 is turned on, electrical charges of the impulse voltage application capacitor Cs move through the current limiting resistor Rs and the back flow preventing diode D, and the equivalent capacitor Cd on the winding 11 side is charged.

Provided that the switch SW is turned on at time t=0 s, no current flows to the equivalent inductor Ld on the winding 11 side immediately after the switch SW is turned on. Accordingly, the voltage Vcd between the external terminals T1 and T2 increases to about 1,000 V, which is the charge voltage (impulse voltage E) of the impulse voltage application capacitor Cs. Note that the degree of increase in voltage Vcd varies according to the characteristics of the winding 11.

Subsequently, current starts to flow through the equivalent resistor Rd to the equivalent inductor Ld, and the voltage Vcd decreases. When the voltage Vcd decreases to about −1,000 V, the impulse voltage generation circuit 2 and the circuit on the winding 11 side are electrically separated from each other by the back flow preventing diode D. Accordingly, at around time t=10 μs in FIG. 3, resonance of the equivalent inductor Ld, the equivalent capacitor Cd and the equivalent resistor Rd on the winding 11 side starts, and the voltage Vcd starts damped oscillation. Subsequently, the voltage Vcd eventually becomes 0 V. Note that the degree of decrease in voltage Vcd and the time significantly vary according to the characteristics of the winding 11.

As described above, the conventional impulse winding testing instrument calculates the LC value and the RC value that are multiplied values of the parameters pertaining to the winding to be tested, based on the measured values of the voltage Vcd in a time period Tx of resonance due to the equivalent inductor, the equivalent capacitor and the equivalent resistor on the winding side.

On the other hand, as shown in FIG. 3, the testing instrument 1 according to Embodiment 1 adopts, as an analysis time period, a predetermined time period Ta from turning on of the switch SW to start of resonance due to the equivalent inductor Ld, the equivalent capacitor Cd and the equivalent resistor Rd on the winding side, and calculates the values of the equivalent inductor Ld, the equivalent capacitor Cd and the equivalent resistor Rd, based on the measured value of the voltage Vcd in the analysis time period Ta and on an equation of transient response of the voltage Vcd based on the equivalent circuit in the analysis time period Ta.

Figure 4:
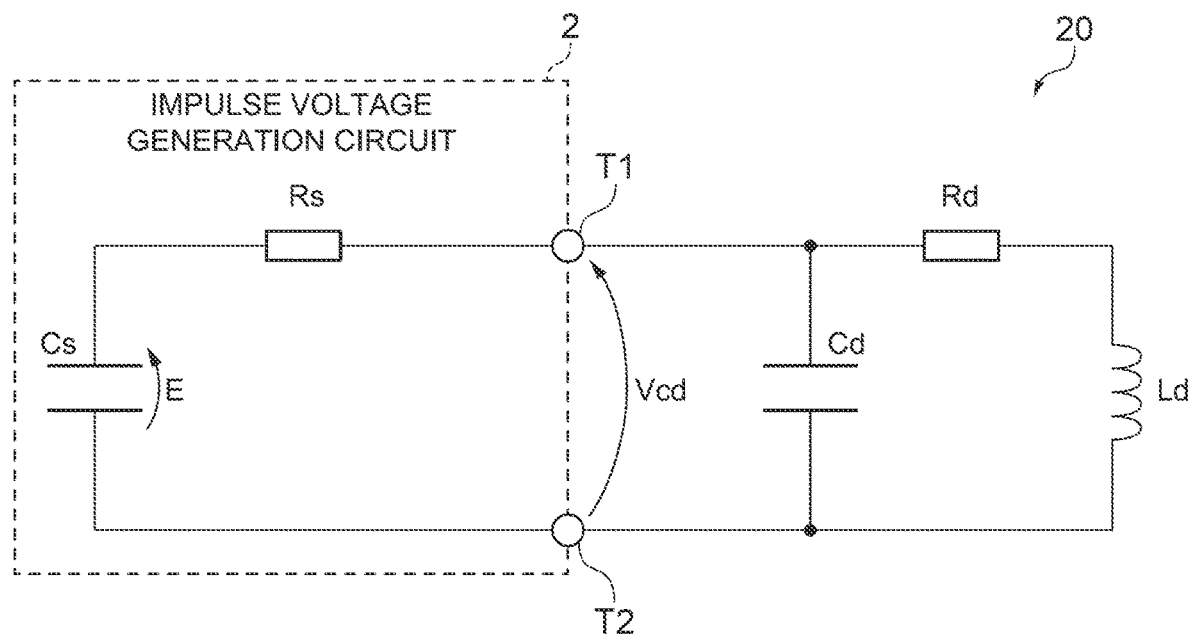
FIG. 4 is a diagram showing an equivalent circuit of the testing instrument according to Embodiment 1 in an analysis time period Ta.

FIG. 4 is a diagram showing the equivalent circuit of the testing instrument 1 according to Embodiment 1 in the analysis time period Ta.

In FIG. 4, the equivalent circuit 20 is shown that includes the impulse voltage generation circuit 2 and the winding 11 in the analysis time period Ta, i.e., the time period during which the switch SW is turned on and current flows in the forward direction through the back flow preventing diode D. Note that in FIG. 4, illustration of the switch SW and the back flow preventing diode D is omitted.

If the on-resistance of the switch SW, the on-resistance of the back flow preventing diode D, and the forward-direction voltage drop are ignored, the impulse voltage generation circuit 2 in a time period during which the switch SW is turned on and current in the forward direction flows through the back flow preventing diode D is equivalently represented by the current limiting resistor Rs and the impulse voltage application capacitor Cs, which are connected in series between the external terminals T1 and T2, as shown in FIG. 4.

In the equivalent circuit 20 shown in FIG. 4, the equation representing the temporal variation (transient response) in voltage Vcd between the external terminals T1 and T2 after the switch SW is turned on is represented by the following expression (1).

[Expression 1]

$$Cs \cdot Rs \cdot Cd \cdot Ld \frac{d^3 Vcd}{dt^3} + (Cs \cdot Ld + Cd \cdot Ld + Cs \cdot Rs \cdot Cd \cdot Rd) \frac{d^2 Vcd}{dt^2} + (Cs \cdot Rs + Cs \cdot Rd + Cd \cdot Rd) \frac{dVcd}{dt} + Vcd = 0 \quad (1)$$

It is assumed that the transient response of the voltage Vcd is represented by the expression (1) described above in the analysis time period Ta shown in FIG. 3. Based on the assumption, regression analysis (e.g., least-square method) is performed based on the measured values of the voltage Vcd in the analysis time period Ta, and the coefficient of each term of the equation (1) described above is calculated, which can derive the values of the equivalent inductor Ld, the equivalent capacitor Cd and the equivalent resistor Rd pertaining to the winding 11 to be inspected.

On the other hand, when a noise component is included in an observed waveform (measured values) of the voltage Vcd, the third order differential term is included in the equation (1) described above. Accordingly, if a typical smoothing process is applied to the measured values of the voltage Vcd, the noise component is possibly incapable of being sufficiently removed.

The testing instrument 1 according to Embodiment 1 may calculate the values of the equivalent inductor Ld, the equivalent capacitor Cd and the equivalent resistor Rd using an equation obtained by integrating the equation (1)

described above multiple times with respect to time t, with the equation being assumed as the equation of the transient response of the voltage Vcd.

Here, for example, a case of using an equation obtained by integrating the equation (1) three times with respect to time t is described.

By integrating the equation (1) three times with respect to time t and determining a constant of integration using an initial condition, the following equation (2) is obtained. Furthermore, the coefficient of each terms of the equation (2) described below are respectively replaced with V, W, X, Y and Z, as in the following expressions (3) to (7).

[Expression 2]

$$-\frac{Rs \cdot Cd}{E}Vcd - \frac{Cs \cdot Ld + Cd \cdot Ld + Cs \cdot Rs \cdot Cd \cdot Rd}{Cs \cdot Ld \cdot E}\int Vcddt - \frac{Cs \cdot Rs + Cs \cdot Rd + Cd \cdot Rd}{Cs \cdot Ld \cdot E}\int\int Vcddt\, dt - \frac{1}{Cs \cdot Ld \cdot E}\int\int\int Vcddt dt dt + \frac{Rd}{Ld}\frac{1}{2}t^2 + t = 0 \quad (2)$$

[Expression 3]

$$V = -\frac{Rs \cdot Cd}{E} \quad (3)$$

[Expression 4]

$$W = -\frac{Cs \cdot Ld + Cd \cdot Ld + Cs \cdot Rs \cdot Cd \cdot Rd}{Cs \cdot Ld \cdot E} \quad (4)$$

[Expression 5]

$$X = -\frac{Cs \cdot Rs + Cs \cdot Rd + Cd \cdot Rd}{Cs \cdot Ld \cdot E} \quad (5)$$

[Expression 6]

$$Y = -\frac{1}{Cs \cdot Ld \cdot E} \quad (6)$$

[Expression 7]

$$Z = \frac{Rd}{Ld}\frac{1}{2} \quad (7)$$

Since the expression (2) described above has no derivative term, no smoothing process is required to be applied to the measured values of the voltage Vcd. Since the expression (2) described above has integral terms, adverse effects of noise can be suppressed. Furthermore, since the equation (2) described above has a greater number of coefficients than the equation (1) described above does, it is easy to identify the parameters (Ld, Cd and Rd).

A method of calculating the parameters (circuit constants) using the aforementioned expression (2) is described below.

First, the parameter calculator 5 of the testing instrument 1 determines an analysis range Ta. For example, as shown in FIG. 3, the parameter calculator 5 detects a maximum point Pmax at which the voltage Vcd is maximized and a minimum point Pmin at which the voltage Vcd is minimized after the switch SW is turned on. The parameter calculator 5 assumes the time period between the maximum point Pmax and the minimum point Pmin as the analysis time period Ta, and assumes a time point at which the switch SW is turned on as t=0.

Here, the maximum point Pmax and the minimum point Pmin may be the maximum point and the minimum point of the measured waveform based on time-series data on the measured values of the voltage Vcd by the voltage measurement circuit 4, or the maximum point and the minimum point of a smoothed waveform obtained by applying a smoothing process to the time-series data on the measured values of the voltage Vcd measured by the voltage measurement circuit 4.

Thereafter, the parameter calculator 5 uses data on the measured values of the voltage Vcd in the analysis time period Ta, and calculates Vcd, ∫Vcddt, ∫∫Vcddt dt, ∫∫∫Vcddtdtdt The parameter calculator 5 calculates t and $t^2$, based on the sampling period of the voltage measurement circuit 4. The parameter calculator 5 creates a normal equation according to a publicly known regression analysis method (e.g., least-square method) using the calculated values, and performs an operation of an inverse matrix or an LU decomposition method, for example, thus obtaining the coefficients V to Z of the terms of the expression (2) described above.

Thereafter, the parameter calculator 5 calculates the values of the equivalent inductor Ld, the equivalent capacitor Cd and the equivalent resistor Rd, based on the calculated coefficients V to Z and the expressions (3) to (7) described above.

First, a method of calculating the value of the equivalent inductor Ld is as follows.

For example, according to the expression (6) described above, the value of the equivalent inductor Ld is represented by the following expression (8).

[Expression 8]

$$Ld = -\frac{1}{Cs \cdot E \cdot Y} \quad (8)$$

Here, since the impulse voltage E has the value set using the testing instrument 1 before the test is performed, the value is already known. Furthermore, since the impulse voltage application capacitor Cs is the value set when the testing instrument 1 was designed, the value is already known. Consequently, the parameter calculator 5 calculates the value of the equivalent inductor Ld by substituting the values of Cs, E and Y in the expression (8) described above.

Thereafter, a method of calculating the equivalent resistor Rd is as follows.

For example, according to the expression (7) described above, the value of the equivalent resistor Rd is represented by the following expression (9).

[Expression 9]

$$Rd = 2Ld \cdot Z \quad (9)$$

The parameter calculator 5 calculates the value of the equivalent resistor Rd by substituting the values of Ld and Z obtained before, in the expression (9) described above.

Lastly, a method of calculating the equivalent capacitor Cd is as follows.

The value of the equivalent capacitor Cd may be calculated using any one of the equations (3), (4) and (5) pertaining to the coefficients V, X and Z or a combination of the equations. On the other hand, the value of the current limiting resistor Rs is included in the expressions (3) to (5) described above. The value of the current limiting resistor Rs itself is already known. However, as described above, in actuality, the impulse voltage generation circuit 2 includes the switch SW and the back flow preventing diode D, which are connected in series with the current limiting resistor Rs, and between the equivalent capacitor Cd and the external terminal T1, not only the current limiting resistor Rs but also the on-resistances and forward-direction voltage drop reside.

Accordingly, the value of the voltage Vcd measured by the testing instrument 1 is affected by the current limiting resistor Rs, and the on-resistances of the switch SW and the back flow preventing diode D and the like. Consequently, when the known value of the current limiting resistor Rs is substituted in the equations (3), (4) and (5), and the value of the equivalent capacitor Cd is calculated, the estimate value of the equivalent capacitor Cd includes an error component based on the on-resistances and the like.

To reduce the adverse effects of errors based on the on-resistances and the like as much as possible, the testing instrument 1 according to Embodiment 1 may use the expression (4) of the coefficient W with which the adverse effects of the estimate error of the current limiting resistor Rs are minimized in a measurement specification range.

For example, according to the expression (4) described above, the value of the equivalent capacitor Cd is represented by the following expression (10).

[Expression 10]

$$Cd = -\frac{Cs \cdot Ld \cdot E \cdot W + Cs \cdot Ld}{Ld + Cs \cdot Rs \cdot Rd} \quad (10)$$

The parameter calculator 5 may calculate the value of the equivalent capacitor Cd by substituting the values of previously obtained Ld, Rd and W and known Cs, E and Rs in the expression (10) described above.

The parameter calculator 5 stores the calculated values of the equivalent inductor Ld, the equivalent capacitor Cd and the equivalent resistor Rd pertaining to the winding 11 to be inspected, as the analysis result information 83, in the memory 8.

Here, information required for the operation by the parameter calculator 5 may be preliminarily stored in the memory 8. For example, a program for calculating the coefficients V, W, X, Y and Z from the measured value of the voltage Vcd, information on the expressions (3) to (7) described above, the value of the current limiting resistor Rs, and the value of the impulse voltage application capacitor Cs and the like may be preliminarily stored, as the expression information 82, in the memory 8. The value of the impulse voltage E set by the user at the start of the test is stored together in the memory 8.

Accordingly, the parameter calculator 5 can calculate the values of the equivalent inductor Ld, the equivalent capacitor Cd and the equivalent resistor Rd, through the operations described above, using the expression information 82 stored in the memory 8, and the value of the impulse voltage E set at the start of the test.

Note that in the description described above, the case where the parameter calculator 5 obtains the values of the equivalent inductor Ld, the equivalent capacitor Cd and the equivalent resistor Rd, based on the expression (2) obtained by integrating the expression (1) three times is described. Without limitation to this description, the values of the equivalent inductor Ld, the equivalent capacitor Cd and the equivalent resistor Rd may be obtained based on an equation obtained by integrating the expression (1) twice. Hereinafter, a method of calculating the values of the equivalent inductor Ld, the equivalent capacitor Cd and the equivalent resistor Rd using the expression obtained by two time integration is described.

By integrating the equation (1) described above twice with respect to time t and determining a constant of integration using an initial condition, the following equation (11) is obtained. Furthermore, the coefficient of each term of the equation (11) described below are respectively replaced with V, W, X, Y and Z, as in the following expressions (12) to (16).

[Expression 11]

$$-\frac{Rs \cdot Cd}{E}\frac{dVcd}{dt} - \frac{Cs \cdot Ld + Cd \cdot Ld + Cs \cdot Rs \cdot Cd \cdot Rd}{Cs \cdot Ld \cdot E}Vcd - \frac{Cs \cdot Rs + Cs \cdot Rd + Cd \cdot Rd}{Cs \cdot Ld \cdot E}\int Vcd\,dt - \frac{1}{Cs \cdot Ld \cdot E}\int\int Vcd\,dt\,dt + \frac{Rd}{Ld}t + 1 = 0 \quad (11)$$

[Expression 12]

$$V = -\frac{Rs \cdot Cd}{E} \quad (12)$$

[Expression 13]

$$W = -\frac{Cs \cdot Ld + Cd \cdot Ld + Cs \cdot Rs \cdot Cd \cdot Rd}{Cs \cdot Ld \cdot E} \quad (13)$$

[Expression 14]

$$X = -\frac{Cs \cdot Rs + Cs \cdot Rd + Cd \cdot Rd}{Cs \cdot Ld \cdot E} \quad (14)$$

[Expression 15]

$$Y = -\frac{1}{Cs \cdot Ld \cdot E} \quad (15)$$

[Expression 16]

$$Z = \frac{Rd}{Ld} \quad (16)$$

The expression (11) described above has one derivative term, and multiple integral terms, which can suppress the adverse effects of noise. In comparison with the coefficient of each term of the expression (2) in the case of three time integration, and the coefficient of each term of the expression (11) described above in the case of two time integration, only "Z" is different.

A method of calculating the parameters (circuit constants) using the aforementioned expression (11) is described below.

First, the parameter calculator 5 of the testing instrument 1 determines an analysis range Ta. The method of determining the analysis range Ta is similar to that in the case of using the expression (2) described above.

Thereafter, the parameter calculator 5 uses data on the measured values of the voltage Vcd in the analysis time period Ta, and calculates $$\frac{dVcd}{dt}, Vcd, \int Vcd\,dt, \int\int Vcd\,dt\,dt$$

The parameter calculator 5 calculates t, based on the sampling period of the voltage measurement circuit 4. The parameter calculator 5 creates a normal equation according to a publicly known regression analysis method using the calculated values, and performs an operation of an inverse matrix or an LU decomposition method or the like, for example, thus obtaining the coefficients V to Z of the terms of the expression (11) described above.

Thereafter, the parameter calculator 5 calculates the values of the equivalent inductor Ld, the equivalent capacitor Cd and the equivalent resistor Rd, based on the calculated coefficients V to Z and the expressions (12) to (16) described above.

First, a method of calculating the value of the equivalent inductor Ld is as follows.

For example, according to the expression (15) described above, the value of the equivalent inductor Ld is represented by the following expression (17).

[Expression 17]

$$L_d = -\frac{1}{Cs \cdot E \cdot Y} \quad (17)$$

Here, as described above, the values of the impulse voltage E and the impulse voltage application capacitor Cs have already been known. Consequently, the parameter calculator 5 calculates the value of the equivalent inductor Ld by substituting the values of Cs, E and Y in the expression (17) described above.

Thereafter, a method of calculating the equivalent resistor Rd is as follows.

For example, according to the expression (16) described above, the value of the equivalent resistor Rd is represented by the following expression (18).

[Expression 18]

$$Rd = Ld \cdot Z \quad (18)$$

The parameter calculator 5 calculates the value of the equivalent resistor Rd by substituting the values of Ld and Z obtained before, in the expression (18) described above.

As to the equivalent capacitor Cd, similar to the case of using the expression (2) obtained by three time integration described above, the parameter calculator 5 can perform calculation using any of the expressions (12) to (14) described above.

As described above, the parameter calculator 5 may obtain the values of the equivalent inductor Ld, the equivalent capacitor Cd and the equivalent resistor Rd, based not only on the expression (2) obtained by integrating the expression (1) three times with respect to time t but also on the expression (11) obtained by integrating the expression (1) twice with respect to time t.

The testing instrument 1 according to the embodiment has not only the aforementioned function of calculating the values of the equivalent inductor Ld, the equivalent capacitor Cd and the equivalent resistor Rd pertaining to the winding 11 to be inspected, but also a function of displaying the theoretical waveform of voltage Vcd based on the calculated values of the equivalent inductor Ld, the equivalent capacitor Cd and the equivalent resistor Rd. The functions are described in detailed below.

In the testing instrument 1 shown in FIG. 1, the waveform generator 6 generates a measured waveform indicating the temporal variation in voltage Vcd, based on time-series data (measured value information 81) of the measured values of voltage Vcd measured by the voltage measurement circuit 4, and stores the waveform as the measured waveform data 84 in the memory 8.

The waveform generator 6 generates a theoretical waveform indicating the temporal variation in voltage Vcd in the equivalent circuit 20, by performing numerical integration using the equation of the transient response (expression (1)) based on the values of the equivalent inductor Ld, the equivalent capacitor Cd and the equivalent resistor Rd (analysis result information 83) calculated by the parameter calculator 5, and stores the waveform as the theoretical waveform data 85 in the memory 8.

The display 7 displays, on the screen, the waveform pertaining to the voltage Vcd, based on the measured waveform data 84 and the theoretical waveform data 85 generated by the waveform generator 6.

Figure 5:
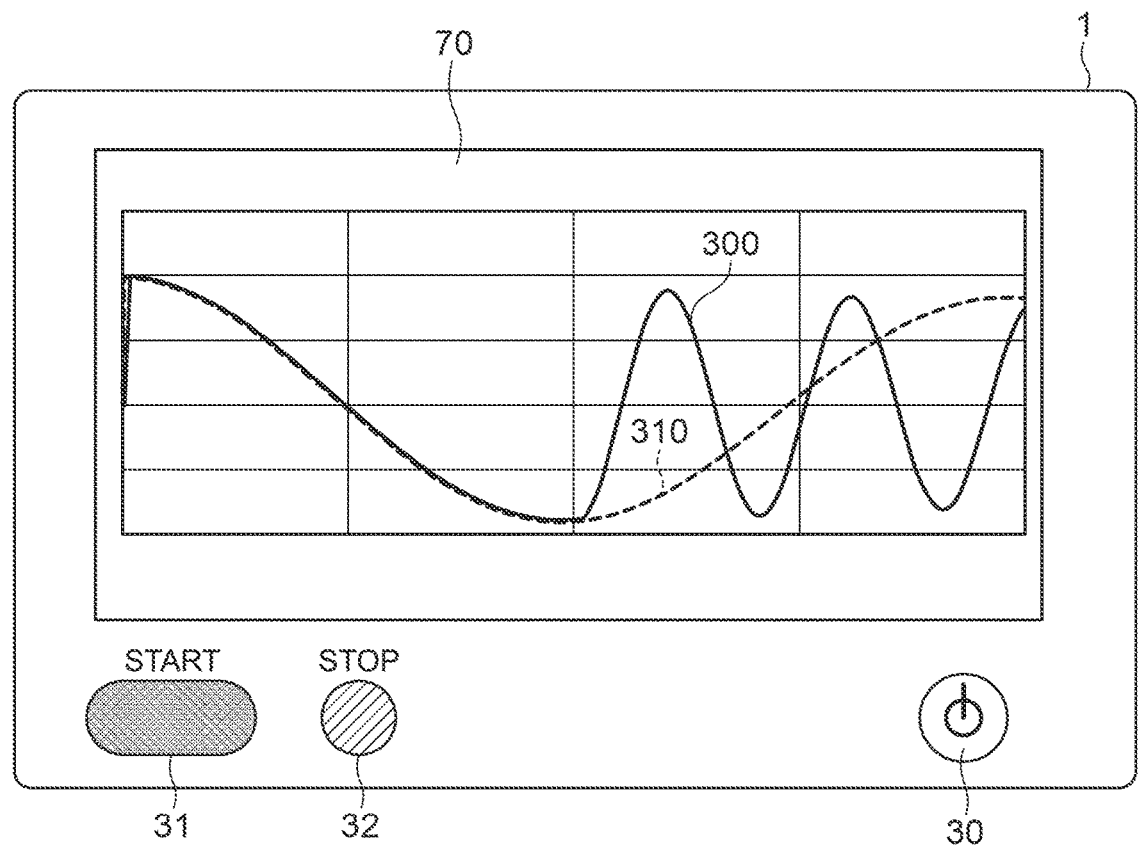
FIG. 5 is a diagram showing an example of a display screen of the testing instrument according to Embodiment 1.

FIG. 5 is a diagram showing an example of the display screen of the testing instrument 1 according to Embodiment 1.

As shown in FIG. 5, the testing instrument 1 includes a display 70 as a unit of achieving functions as those of the display 7. The testing instrument 1 displays information for setting the test conditions, and information on the test result and the like, on the screen of the display 70. For example, the display 70 is mounted with a touch panel. Part of the functions of the instruction input interface 3 is achieved by the display 70. For example, the user can set the test conditions and the like by touching the screen of the display 70.

The testing instrument 1 may include various physical buttons as a unit for achieving part of functions of the instruction input interface 3. For example, as shown in FIG. 5, the testing instrument 1 may include an activation button (power source button) 30 for activating the testing instrument 1, a start button 31 for starting a test, and a stop button 32 for stopping the test and the like.

The display 7 displays the measured waveform 300 and the theoretical waveform 310 of the voltage Vcd on the screen of the display 70, based on the measured waveform data 84 and the theoretical waveform data 85 stored in the memory 8. For example, as shown in FIG. 5, the display 7 displays the measured waveform 300 and the theoretical waveform 310 of the voltage Vcd together, on the screen of the display 70. For example, the display 7 may display the measured waveform 300 and the theoretical waveform 310 in an overlaid manner as shown in FIG. 5, or display the waveforms in the vertical direction or the lateral direction on the screen of the display 70 in a juxtaposed manner.

The display 7 may display, on the display 70, the measured waveform 300 and the theoretical waveform 310 immediately after calculating the parameters (Ld, Cd and Rd), or display, on the display 70, the measured waveform 300 and theoretical waveform 310 according to an operation by the user on the instruction input interface 3. The display 7 may display only one of the measured waveform 300 and the theoretical waveform 310 on the display 70.

Thereafter, a flow of a method of analyzing the winding 11 to be tested using the testing instrument 1 according to Embodiment 1 is described.

Figure 6:
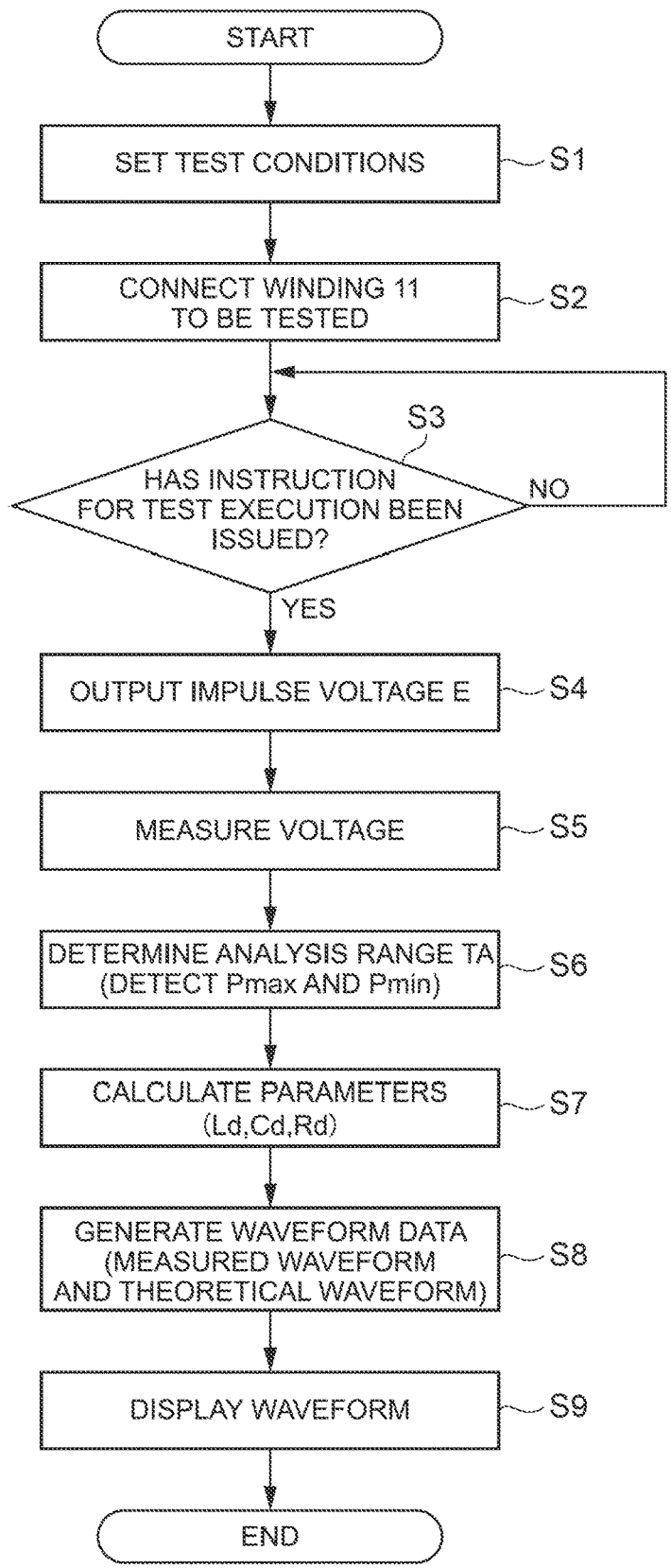
FIG. 6 is a flowchart showing a flow of a method of analyzing a winding using the testing instrument according to Embodiment 1.

FIG. 6 is a flowchart showing a flow of a method of analyzing a winding 11 using the testing instrument 1 according to Embodiment 1.

For example, the user activates the testing instrument 1 by operating the activation button 30, and subsequently applies a touching operation onto the display 70 as the instruction input interface 3, thus setting test conditions and the like in the testing instrument 1 (step S1). For example, the user sets the value of the impulse voltage E, and the sampling period (sampling frequency) for measuring the voltage Vcd and the like, in the testing instrument 1.

Note that in an initial state after activation of the testing instrument 1, the switch SW of the impulse voltage generation circuit 2 is in an off state.

Thereafter, the user connects the winding 11 to be tested, between the external terminals T1 and T2 of the testing instrument 1 (step S2). Note that the winding 11 may be connected to the testing instrument 1 before step S1.

Thereafter, the testing instrument 1 determines whether an instruction for executing a test is input by the user or not (step S3). For example, when the start button 31 is not operated by the user (step S3: NO), the testing instrument 1 stands by until the start button 31 is operated.

When the start button 31 is operated (step S3: YES), the testing instrument 1 outputs the impulse voltage E between one end of the current limiting resistor Rs and the external terminal T2 via the switch SW (step S4). Specifically, according to the instruction from the instruction input interface 3, the impulse voltage generation circuit 2 charges the impulse voltage application capacitor Cs with a direct-current power source, not shown, so that the voltage of the impulse voltage application capacitor can be the impulse voltage E set in step S1. Thereafter, the impulse voltage generation circuit 2 turns on the switch SW. Accordingly, the voltage Vcd is applied between the external terminals T1 and T2.

For example, at the same time of step S4, the testing instrument 1 starts to measure the voltage Vcd between the external terminals T1 and T2 (step S5). Specifically, as described above, the voltage measurement circuit 4 measures the voltage Vcd between the external terminals T1 and T2 based on the sampling period set in step S1, and stores time-series data on measured values of voltage Vcd, as measured value information 81, in the memory 8.

Thereafter, the parameter calculator 5 determines the analysis range Ta (step S6). Specifically, the parameter calculator 5 detects the maximum point Pmax and the minimum point Pmin of the voltage Vcd, based on the time-series data on the measured values of the voltage Vcd obtained in step S5 according to the method described above, and adopts the time period between the maximum point Pmax and the minimum point Pmin as the analysis time period Ta.

Thereafter, the parameter calculator 5 calculates the values of the equivalent inductor Ld, the equivalent capacitor Cd and the equivalent resistor Rd pertaining to the winding 11, according to the method described above, using the measured value of the voltage Vcd in the analysis time period Ta set in step S6, and the expression information 82 stored in the memory 8 (step S7).

Thereafter, the waveform generator 6 generates the measured waveform data 84, according to the method described above, based on the measured value of the voltage Vcd obtained in step S5, and generates the theoretical waveform data 85 using the values of the equivalent inductor Ld, the equivalent capacitor Cd and the equivalent resistor Rd pertaining to the winding 11 calculated in step S7 (step S8).

Thereafter, for example, the display 7 displays the measured waveform 300 and theoretical waveform 310 on the screen of the display 70 of the testing instrument 1 in an overlaid manner, based on the measured waveform data 84 and the theoretical waveform data 85 generated in step S8 (step S9).

Note that the process of generating the waveform data (step S8) and the process of displaying the waveform (step S9) described above may be executed only when the user operates the testing instrument 1, and the instruction input interface 3 accepts the instruction for displaying the waveform from the user, for example.

As described above, the testing instrument 1 according to Embodiment 1 includes the parameter calculator 5 that calculates the value of the equivalent inductor Ld, the value of the equivalent capacitor Cd, and the value of the equivalent resistor Rd in a case of equivalently representing the winding 11 to be inspected connected between the external terminals T1 and T2 by the equivalent inductor Ld connected between the external terminals T1 and T2, the equivalent capacitor Cd connected between the external terminals T1 and T2, and the equivalent resistor Rd connected in series with the equivalent inductor Ld between the external terminals T1 and T2, based on the measured value of the voltage Vcd between the external terminals T1 and T2 measured by the voltage measurement circuit 4.

The parameter calculator 5 calculates, of the measured value information 81 stored in the memory 8, at least one of the values of the equivalent capacitor Cd, the equivalent inductor Ld and the equivalent resistor Rd by performing regression analysis using the measured value of the voltage Vcd in the predetermined time period (analysis time period Ta) from turning on of the switch SW to start of resonance based on the equivalent inductor Ld, the equivalent capacitor Cd and the equivalent resistor Rd on the winding 11 side.

Thus, as with the case of the conventional impulse winding test machine, the measured value of the voltage Vcd (measured waveform) before start of the resonance is used instead of using the equivalent inductor Ld, the equivalent capacitor Cd and the equivalent resistor Rd on the winding 11 side. Accordingly, the process of analyzing the winding 11 can be started more quickly.

As described above, the conventional impulse winding test machine uses the equation and the measured values of the voltage Vcd during resonance based on the equivalent inductor Ld, the equivalent capacitor Cd and the equivalent resistor Rd on the winding 11 side. Accordingly, only multiplied values of the parameters, such as the LC value and the RC value, can be calculated. On the other hand, the testing instrument 1 according to Embodiment 1 performs the operation based on the equation of the transient response of the voltage Vcd in the equivalent circuit before start of the resonance. Accordingly, the values of the equivalent inductor Ld, the equivalent capacitor Cd and the equivalent resistor Rd can be individually calculated.

As described above, by the testing instrument 1 according to Embodiment 1, the characteristics of a winding to be tested can be analyzed easily in shorter time.

In the testing instrument 1 according to Embodiment 1, after the switch SW is turned on, the parameter calculator 5 detects the maximum point Pmax at which the voltage Vcd is maximized, and the minimum point Pmin at which the voltage Vcd is minimized, and the time period between the maximum point Pmax and the minimum point Pmin is adopted as the analysis time period Ta.

Accordingly, the analysis time period Ta to which the equation of the transient response based on the equivalent circuit 20 is applicable can be easily determined.

The testing instrument 1 may further include the back flow preventing diode D as a rectifier element configured to be connected between the other end of the impulse voltage application capacitor Cs and the external terminal T1 in series with the switch SW and the current limiting resistor Rs, allow current to pass from the impulse voltage application capacitor Cs side to the external terminal T1 side, and block current from the external terminal T1 side to the impulse voltage application capacitor Cs side.

Accordingly, the analysis time period Ta by the testing instrument 1 described above, and the resonant time period Tx due to the equivalent inductor Ld, the equivalent capacitor Cd and the equivalent resistor Rd on the winding 11 side can be clearly isolated from each other. The user can easily determine which timing resonance due to the equivalent inductor Ld, the equivalent capacitor Cd and the equivalent resistor Rd is started, by observing the measured waveform of the voltage Vcd.

The parameter calculator 5 calculates the coefficients of the equation of the transient response of the voltage Vcd in the equivalent circuit (see FIG. 4) that includes the equivalent inductor Ld, the equivalent capacitor Cd and the equivalent resistor Rd, and the impulse voltage application capacitor Cs and the current limiting resistor Rs by performing regression analysis using the measured values of the voltage Vcd in the predetermined time period (analysis time period Ta), and calculates the value of the equivalent capacitor Cd, the value of the equivalent inductor Ld, and the value of the equivalent resistor Rd, based on the calculated coefficients.

Accordingly, the values of the equivalent inductor Ld, the equivalent capacitor Cd and the equivalent resistor Rd can be more correctly calculated.

The equation of the transient response of the equivalent circuit 20 used for the aforementioned analysis of the winding 11 by the testing instrument 1 may be an expression obtained by integrating multiple times the differential equation (expression (1)) representing the temporal variation in voltage Vcd in the equivalent circuit 20.

As described above, the expression (1) described above representing the transient response of the voltage Vcd in the equivalent circuit 20 includes the third order differential term. Accordingly, if the equation (1) is used as it is, the noise component included in the waveform of the measured voltage Vcd is possibly enhanced. On the other hand, the testing instrument 1 according to Embodiment 1 can remove the derivative term using the expression obtained by integrating the equation (1) described above multiple times, and suppress the adverse effects of the noise component included in the waveform of the measured voltage Vcd.

For example, the derivative term can be removed using the expression (11) described above obtained by integrating the equation (1) described above two times. Accordingly, the noise component included in the measured value of the voltage Vcd can be effectively suppressed. The derivative term can be further removed using the expression (2) described above obtained by integrating the equation (1) described above three times. Accordingly, the noise component included in the measured value of the voltage Vcd can be more effectively suppressed.

Note that an expression obtained by integrating the equation (1) described above once can be used.

Furthermore, the testing instrument 1 according to Embodiment 1 includes the waveform generator 6 that generates the theoretical waveform of the voltage Vcd by performing numerical integration using the equation of the transient response, based on the value of the equivalent capacitor Cd, the value of the equivalent inductor Ld and the value of the equivalent resistor Rd on the winding 11 side calculated by the parameter calculator 5, and the display 7 that displays the theoretical waveform 310 generated by the waveform generator 6, and the measured waveform 300 of the voltage Vcd measured by the voltage measurement circuit 4.

Accordingly, the user can visually compare the actually measured waveform 300 with the theoretical waveform 310 obtained by the analysis, thus allowing the user to easily determine whether the parameters (the equivalent inductor Ld, the equivalent capacitor Cd and the equivalent resistor Rd) pertaining to the winding 11 obtained by the analysis by the testing instrument 1 are appropriate values.

Embodiment 2

Figure 7:
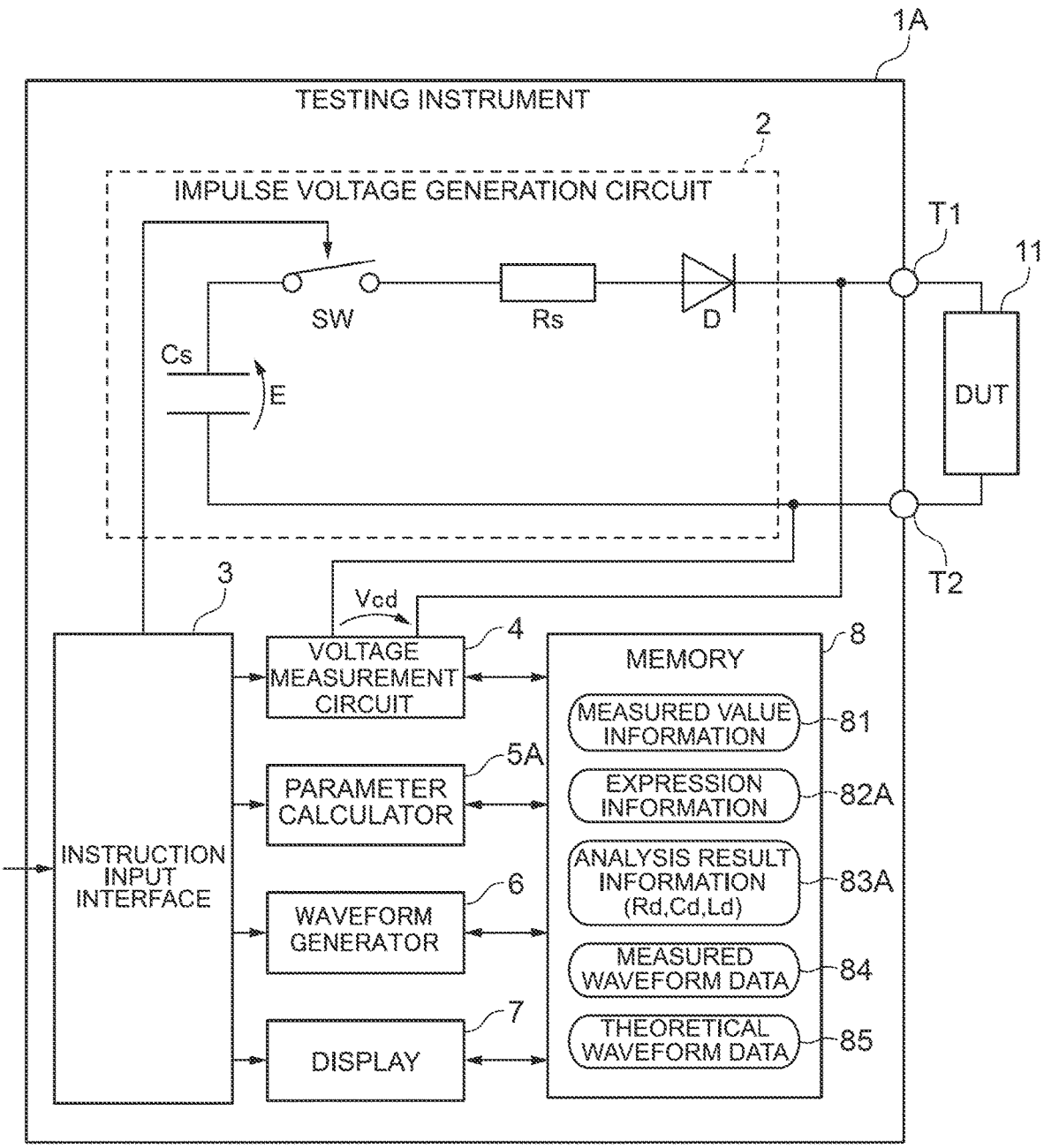
FIG. 7 is a diagram showing a configuration of a testing instrument according to Embodiment 2.

FIG. 7 is a diagram showing a configuration of a testing instrument 1A according to Embodiment 2.

In general, in a case where a winding to be tested includes a core, the attenuation of the waveform is large owing to the iron loss of the core. When a high application voltage is applied to the winding, magnetic saturation occurs in the core, the parameters, such as the inductance, of the winding largely changes, and the non-linearity becomes strong.

As described above, the conventional impulse winding testing instrument calculates the LC value and the RC value using the waveform of the resonance phenomenon after the internal circuit of the impulse winding testing instrument and the winding to be tested are separated from each other by the back flow preventing diode in terms of circuitry. Accordingly, when the waveform is attenuated, the error of calculating the parameter becomes large. When magnetic saturation occurs, the non-linearity of the parameters becomes strong. Accordingly, the obtained parameter possibly has an inappropriate value.

Also in a case where the configuration of the coil to be tested is complicated, ringing and locally large fluctuations occur in the response waveform, and the calculated parameters pertaining to the winding sometimes have inappropriate values. In such a case, the parameters pertaining to the winding sometimes have negative values, or values largely deviating from the values of actual parameters.

Accordingly, the testing instrument 1A according to Embodiment 2 includes a simpler equivalent circuit in an analysis time period with low attenuation, which reduces the number of unknowns in regression analysis, and makes it unlikely to calculate inappropriate values as parameters pertaining to the winding, while preventing occurrence of an error due to the small amplitude of the waveform.

The testing instrument 1A shown in FIG. 7 is different from the testing instrument 1 according to Embodiment 1 in that the value of the equivalent inductor Ld, the value of the equivalent capacitor Cd and the value of the equivalent resistor Rd pertaining to the winding 11 to be tested are calculated by a simpler method, while being similar to the testing instrument 1 according to Embodiment 1 in the other points.

As shown in FIG. 7, the testing instrument 1A includes a parameter calculator 5A instead of the parameter calculator 5 according to Embodiment 1.

The parameter calculator 5A calculates the value of the equivalent capacitor Cd, based on an equation indicating the relationship between the impulse voltage application capacitor Cs and the equivalent capacitor Cd and on the measured value information 81 stored in the memory 8, the equation assuming that the initial value $Vcd|_{t=0}$ of the voltage Vcd in the predetermined time period (analysis time period Ta) coincides with the voltage obtained by dividing the charge voltage Vcs (=E) of the impulse voltage application capacitor Cs between this impulse voltage application capacitor Cs and the equivalent capacitor Cd.

Figure 8:
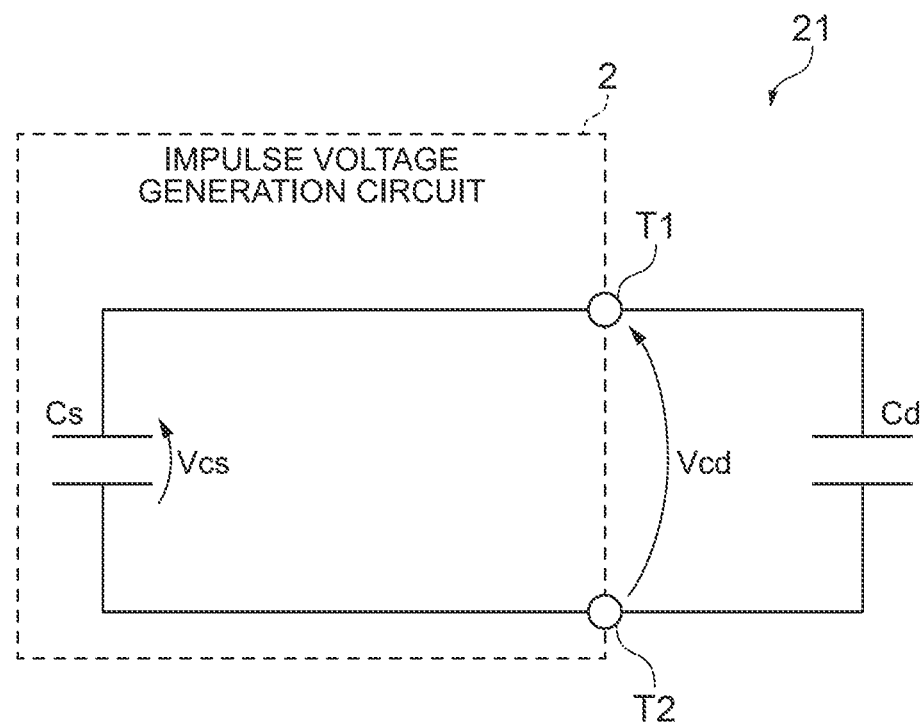
FIG. 8 is a diagram showing an example of an equivalent circuit based on an impulse voltage generation circuit and a winding when a switch is turned on in the testing instrument according to Embodiment 2.

FIG. 8 is a diagram showing an example of an equivalent circuit based on the impulse voltage generation circuit 2 and the winding 11 when the switch SW is turned on in the testing instrument 1A according to Embodiment 2.

In the equivalent circuit 21 shown in FIG. 8, the current limiting resistor Rs is assumed as zero (Rs=0), and the on-resistance of the switch SW and the on-resistance of the back flow preventing diode D are ignored.

In Embodiment 2, it is assumed that when the switch SW is turned on, i.e., at time t=0, the impulse voltage generation circuit 2 and the winding 11 are represented by the equivalent circuit 21 as shown in FIG. 8. The equivalent circuit 21 has the impulse voltage application capacitor Cs and the equivalent capacitor Cd connected with each other in parallel, in a manner intervening between the external terminals T1 and T2.

It is assumed that the value of the voltage Vcd at the time t=0 is the initial value $Vcd|_{t=0}$ of the voltage Vcd, and the voltage Vcd is the maximum value Vmax at the time t=0. It is then assumed that the initial value $Vcd|_{t=0}$(=Vmax) of the voltage Vcd coincides with the voltage obtained by dividing the charge voltage Vcs of the impulse voltage application capacitor Cs between this impulse voltage application capacitor Cs and the equivalent capacitor Cd.

According to the above assumptions, in the equivalent circuit 21, the following expression (19) holds. Here, the initial value $Vcs|_{t=0}$ of the voltage Vcs of the impulse voltage application capacitor Cs is assumed as the charge voltage E ($Vcs|_{t=0}$=E).

[Expression 19]

$$Cd = Cs \frac{Vcs|_{t=0} - Vcd|_{t=0}}{Vcd|_{t=0}} \quad (19)$$

The parameter calculator 5A calculates the value of the equivalent capacitor Cd by substituting the value of the initial value $Vcd|_{t=0}$ of the voltage Vcd based on the measured value information 81, the value of the impulse voltage application capacitor Cs, and the initial value $Vcs|_{t=0}$(=E) of the voltage Vcs, in the expression (19) described above.

Note that the value (Vmax) of the initial value $Vcd|_{t=0}$ of the voltage Vcd based on the measured value information 81 may be, for example, the voltage (actually measured value) at the maximum point Pmax of the time-series data on the voltage Vcd in the time period from turning on of the switch SW to start of resonance based on the equivalent inductor Ld, the equivalent capacitor Cd and the equivalent resistor Rd pertaining to the winding 11, or the voltage at the maximum point of the smoothed waveform after the smoothing process (e.g., the smoothing process using a moving average window) is applied to the time-series data on the voltage Vcd.

Thereafter, the parameter calculator 5A assumes that the impulse voltage generation circuit 2 and the winding 11 after the switch SW is turned on (t>0) are represented by an equivalent circuit 22 that includes the equivalent inductor Ld and the equivalent resistor Rd, and the impulse voltage application capacitor Cs and the current limiting resistor Rs.

Figure 9:
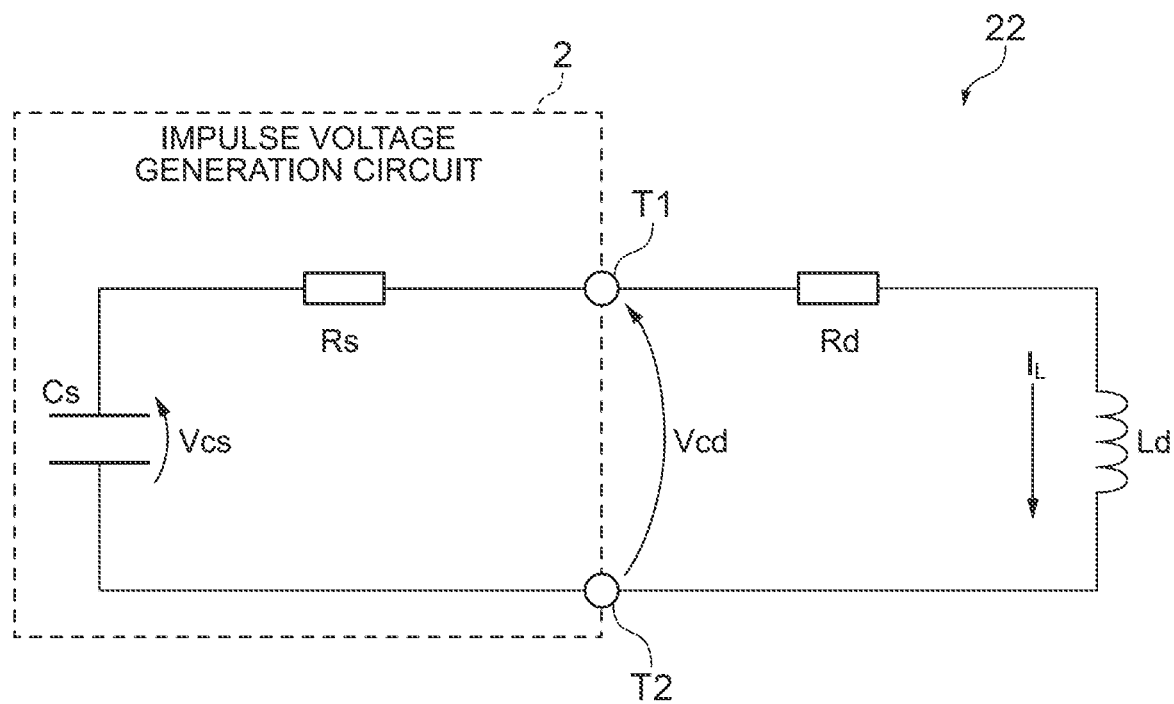
FIG. 9 is a diagram showing an example of an equivalent circuit based on the impulse voltage generation circuit and the winding after the switch is turned on (t>0) in the testing instrument according to Embodiment 2.

FIG. 9 is a diagram showing an example of the equivalent circuit 22 based on the impulse voltage generation circuit 2 and the winding 11 after the switch SW is turned on (t>0) in the testing instrument 1A according to Embodiment 2.

Note that in FIG. 9, illustration of the switch SW and the back flow preventing diode D is omitted.

If the on-resistance of the switch SW, the on-resistance of the back flow preventing diode D, and the forward-direction voltage drop are ignored, the impulse voltage generation circuit 2 in a time period during which the switch SW is turned on (t>0) and subsequently current in the forward direction flows through the back flow preventing diode D is equivalently represented by the current limiting resistor Rs and the impulse voltage application capacitor Cs, which are connected in series between the external terminals T1 and T2, as shown in FIG. 9. The circuit on the winding 11 side after the switch SW is turned on (t>0) is equivalently represented by the equivalent resistor Rd and the equivalent inductor Ld connected in series between the external terminals T1 and T2.

Consequently, in Embodiment 2, the equivalent circuit 22 after the switch SW is turned on (t>0) is a circuit obtained by removing the equivalent capacitor Cd from the equivalent circuit 20 (see FIG. 4) in Embodiment 1.

In the equivalent circuit 22, the equation representing the temporal variation (transient response) in voltage Vcd between the external terminals T1 and T2 after the switch SW is turned on is represented by the following expression (20).

[Expression 20]

$$Cs \cdot Ld \frac{d^2 Vcd}{dt^2} (Cs \cdot Rs + Cs \cdot Rd) \frac{dVcd}{dt} + Vcd = 0 \quad (20)$$

The parameter calculator 5A calculates the coefficients of the equation of the transient response of the voltage Vcd (expression (20) described above) in the predetermined time period by performing regression analysis using the measured value of the voltage Vcd in the predetermined time period (analysis time period Ta), and calculates the value of the equivalent inductor Ld and the value of the equivalent resistor Rd, based on the calculated coefficients and the initial value $Vcd|_{t=0}$ of the voltage Vcd.

For example, the parameter calculator 5A creates a normal equation using the time-series data on the voltage Vcd in the analysis time period Ta stored as the measured value information 81 in the memory 8 according to a publicly known regression analysis method (e.g., least-square method), and obtains the coefficient of each term of the expression (20) described above by performing an operation of an inverse matrix or an LU decomposition method or the like, for example. Thereafter, the parameter calculator 5A calculates the values of the equivalent inductor Ld and the equivalent resistor Rd, based on the calculated coefficients and on the values of Cs and Rs preliminarily stored in the memory 8.

Note that the second order derivative is included in the expression (20) described above. Accordingly, the noise included in the measured result of the voltage Vcd is prone to be emphasized. That is, the second order derivative is strongly affected by the local variation in waveform, such as ringing due to the parasitic capacitance and parasitic inductance, which are not represented in the equivalent circuit 22. Accordingly, the estimate value of the constant by the least-square method can possibly, easily be fluctuated.

To further improve the calculation accuracies of the equivalent inductor Ld and the equivalent resistor Rd, the parameter calculator 5A may calculate the equivalent inductor Ld and the equivalent resistor Rd by performing regression analysis based on an expression obtained by integrating the expression (20) described above.

For example, the parameter calculator 5A may obtain the values of the equivalent inductor Ld and the equivalent resistor Rd, based on the following expression (21) obtained by applying definite integration once to the expression (20) described above with respect to time t from time t=0 to time t=a.

[Expression 21]

$$Cs \cdot Ld \frac{dVcd}{dt}\Big|_{t=a} + (Cs \cdot Rs + Cs \cdot Rd)Vcd|_{t=a} + \int_0^a Vcd\,dt - Cs \cdot Rd \cdot Vcd|_{t=0} = 0 \quad (21)$$

What is obtained by deforming the expression (21) described above can be represented by the following expression (22).

[Expression 22]

$$Ld \frac{dVcd}{dt}\Big|_{t=a} + Rd(Vcd|_{t=a} - Vcd|_{t=0}) = -Rs \cdot Vcd|_{t=a} - \frac{1}{Cs}\int_0^a Vcd\,dt \quad (22)$$

The parameter calculator 5A creates a normal equation (e.g., a simultaneous linear equation) using the time-series data on the voltage Vcd in the analysis time period Ta stored as the measured value information 81 in the memory 8 according to a publicly known regression analysis method (e.g., least-square method), and calculates the coefficient of each term of the expression (22) by performing an operation of an inverse matrix or an LU decomposition method, for example. Thereafter, the parameter calculator 5A calculates the values of the equivalent inductor Ld and the equivalent resistor Rd, based on the calculated coefficients and on the values of Cs and Rs preliminarily stored in the memory 8.

The parameter calculator 5A stores the values of the equivalent capacitor Cd, the equivalent inductor Ld and the equivalent resistor Rd calculated by the method described above, as analysis result information 83A, in the memory 8.

Similar to Embodiment 1, information required for the operation by the parameter calculator 5A may be preliminarily stored in the memory 8. For example, an operation expression for calculating the coefficients of the expression (20) described above, the expression (21) described above or the expression (22) described above from the measured value of the voltage Vcd, the value of the current limiting resistor Rs, and the value of the impulse voltage application capacitor Cs and the like may preliminarily be stored, as expression information 82A, in the memory 8.

Accordingly, the parameter calculator 5A can calculate the values of the equivalent capacitor Cd, the equivalent inductor Ld and the equivalent resistor Rd, through the operations described above, using the measured value information 81, the expression information 82, and the value of the impulse voltage E set at the start of the test stored in the memory 8.

In the testing instrument 1A according to Embodiment 2, similar to the testing instrument 1 according to Embodiment 1, the waveform generator 6 generates a measured waveform 300 indicating the temporal variation in voltage Vcd, based on time-series data (measured value information 81) of the measured values of voltage Vcd measured by the voltage measurement circuit 4, and stores the waveform as the measured waveform data 84 in the memory 8. The waveform generator 6 generates a theoretical waveform 310 indicating the temporal variation in voltage Vcd in the equivalent circuit 22, by performing numerical integration using the equation of the transient response (expression (20) described above), based on the values of the equivalent capacitor Cd, the equivalent inductor Ld and the equivalent resistor Rd (analysis result information 83A) calculated by the parameter calculator 5A, and stores the waveform as the theoretical waveform data 85 in the memory 8.

Similar to the testing instrument 1 according to Embodiment 1, the display 7 displays the measured waveform 300 and the theoretical waveform 310 of the voltage Vcd on the screen of the display 70, based on the measured waveform data 84 and the theoretical waveform data 85 stored in the memory 8.

Thereafter, a flow of a method of analyzing the winding 11 to be tested using the testing instrument 1A according to Embodiment 2 is described.

Figure 10:
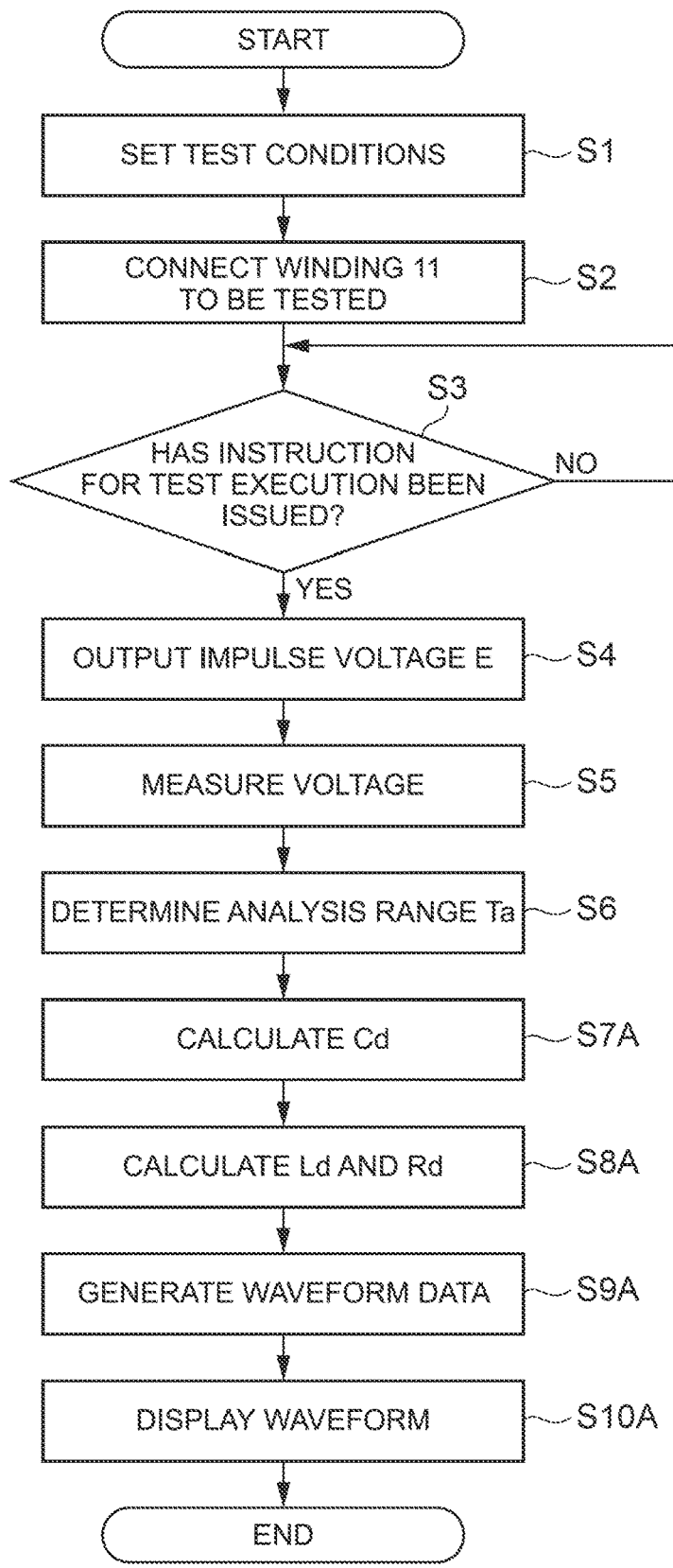
FIG. 10 is a flowchart showing a flow of a method of analyzing a winding using the testing instrument according to Embodiment 2.

FIG. 10 is a flowchart showing a flow of a method of analyzing the winding 11 using the testing instrument 1A according to Embodiment 2.

In the flowchart shown in FIG. 10, processes from step S1 to step S6 are similar to those in the flowchart (FIG. 6) according to Embodiment 1.

After step S6, the parameter calculator 5A calculates the equivalent capacitor Cd pertaining to the winding 11, according to the method described above, using the initial value $Vcd|_{t=0}$(=Vmax) of the voltage Vcd at time t=0 in the analysis time period Ta set in step S6, and the expression information 82A stored in the memory 8 (step S7A).

Thereafter, the parameter calculator 5A calculates the equivalent inductor Ld and the equivalent resistor Rd pertaining to the winding 11, according to the method described above, using the time-series data on the measured values of the voltage Vcd after time t=0 in the analysis time period Ta set in step S6, and the expression information 82A stored in the memory 8 (step S8A).

Thereafter, the waveform generator 6 generates the measured waveform data 84, according to the method described above, based on the measured value of the voltage Vcd obtained in step S5, and generates the theoretical waveform data 85 using the values of the equivalent capacitor Cd, the equivalent inductor Ld and the equivalent resistor Rd pertaining to the winding 11 calculated in step S7A and step S8A (step S9A).

Thereafter, for example, the display 7 displays the measured waveform 300 and theoretical waveform 310 on the screen of the display 70 of the testing instrument 1 in an overlaid manner, based on the measured waveform data 84 and the theoretical waveform data 85 generated in step S9A (step S10A).

Similar to the testing instrument 1 according to Embodiment 1, the process of generating the waveform data (step S9A) and the process of displaying the waveform (step S10A) described above may be executed only when the instruction input interface 3 accepts the instruction for displaying the waveform from the user, for example.

As described above, in the testing instrument 1A according to the embodiment 2, the parameter calculator 5A calculates the value of the equivalent capacitor Cd, based on the equation (expression (19) described above) indicating the relationship between the impulse voltage application capacitor Cs and the equivalent capacitor Cd and on the measured value information 81 stored in the memory 8, the equation assuming that the initial value $Vcd|_{t=0}$ of the voltage Vcd in the predetermined time period (analysis time period Ta) coincides with the voltage obtained by dividing the charge voltage Vcs of the impulse voltage application capacitor Cs between this impulse voltage application capacitor Cs and the equivalent capacitor Cd.

Accordingly, the equivalent capacitor Cd that is one of the parameters pertaining to the winding 11 to be tested can be calculated without complicated operations. Even if calculation is made with the value of $Vcd|_{t=0}$ deviating from an optimal value owing to ringing of the waveform or the like, Cd is not included in the expression (20). Accordingly, even if the calculation is made with the value of $\text{Vcd}|_{t=0}$ deviating from the optimal value, the values of the calculated constant Ld and constant Rd are unlikely to have inappropriate values.

The parameter calculator 5A calculates the coefficients of the equation (e.g., the expression (20) or (22) described above) of the transient response of the voltage Vcd in the equivalent circuit 22 that includes the equivalent inductor Ld and the equivalent resistor Rd, and the impulse voltage application capacitor Cs and the current limiting resistor Rs by performing regression analysis using the measured values of the voltage Vcd in the predetermined time period (analysis time period Ta), and calculates the value of the equivalent inductor Ld and the value of the equivalent resistor Rd, based on the calculated coefficients and the initial value $\text{Vcd}|_{t=0}$ of the voltage.

Thus, the simpler equivalent circuit is used in comparison with the conventional art. Accordingly, the number of unknowns (equivalent capacitor Cd) can be reduced by one, which can reduce the order of the equation of the transient response (differential equation) in the regression analysis. Accordingly, even if magnetic saturation occurs or the configuration of the coil to be tested is complicated, values inappropriate for the equivalent inductor Ld and the equivalent resistor Rd are unlikely to be calculated.

As described above, the parameter calculator 5A may perform regression analysis based on the expression (expression (21) or (22)) obtained by integrating the expression (20) described above. Thus, the term of the second order derivative included in the expression (20) described above can be removed. Accordingly, the adverse effects of noise corresponding to the second order derivative included in the measured value of the voltage Vcd can be suppressed. As for the term of the first order derivative, for example, the smoothing process described above is applied to the measured result of the voltage Vcd (time-series data), which can suppress the adverse effects of noise corresponding to the first order derivative included in the voltage Vcd. Thus, the regression analysis based on the expression obtained by integrating the expression (20) described above, which can more accurately calculate the equivalent inductor Ld and the equivalent resistor Rd.

Note that in Embodiment 2, the equation of the transient response used for regression analysis may be an expression obtained by integrating the differential equation representing temporal variation in voltage Vcd of the equivalent circuit 22 with respect to time. The expression is not limited to the expressions (21) and (22) described above obtained by applying definite integration to the expression (20) described above once with respect to time t from time t=0 to time t=a. For example, the parameter calculator 5A may calculate the equivalent inductor Ld and the equivalent resistor Rd by performing regression analysis based on the expression obtained by applying definite integration twice to the expression (20) described above with respect to time t from time t=0 to time t=a.

As described above, the testing instrument 1A according to Embodiment 2 displays the measured waveform 300 and the theoretical waveform 310 of the voltage Vcd on the screen of the display 70, based on the measured waveform data 84 and the theoretical waveform data 85.

Thus, the user can easily compare the measured waveform with the theoretical waveform, which facilitates determining whether the obtained analysis result (parameters) have appropriate values or not.

Embodiment 3

Figure 11:
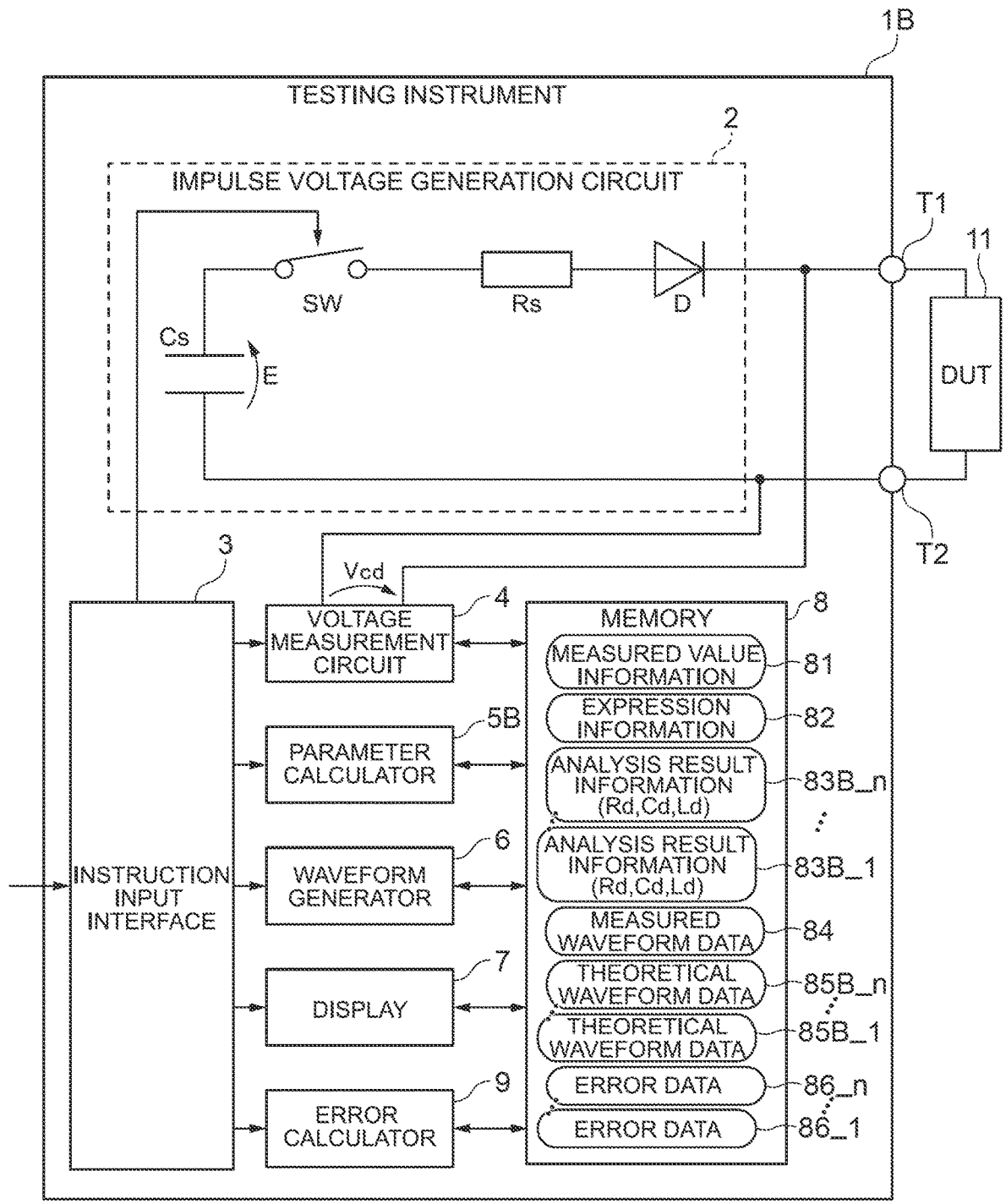
FIG. 11 is a diagram showing a configuration of a testing instrument according to Embodiment 3.

FIG. 11 is a diagram showing a configuration of a testing instrument 1B according to Embodiment 3.

The testing instrument 1B according to Embodiment 3 is different from the testing instrument 1A according to Embodiment 2 in that the device changes the value that is the initial value $\text{Vcd}|_{t=0}$ of the voltage Vcd, calculates multiple data combinations of the equivalent inductors Ld, the equivalent capacitors Cd and the equivalent resistors Rd, calculates the error between the theoretical waveform and the measured waveform based on each data combination, and adopts the data combination corresponding to the theoretical waveform having the minimum error as the analysis result of the winding 11 to be tested, while being similar to the testing instrument 1A according to Embodiment 2 in the other points.

As shown in FIG. 11, the testing instrument 1B includes a parameter calculator 5B instead of the parameter calculator 5A according to Embodiment 2, and further includes an error calculator 9.

The parameter calculator 5B has a function of calculating multiple data combinations including the equivalent capacitors Cd, the equivalent inductors Ld and the equivalent resistors Rd, in addition to the function of the parameter calculator 5A according to Embodiment 2.

Specifically, the parameter calculator 5B changes the initial value $\text{Vcd}|_{t=0}$ of the voltage Vcd to multiple different values, and calculates the value of the equivalent capacitor Cd, the value of the equivalent inductor Ld and the value of the equivalent resistor Rd for each changed initial value $\text{Vcd}|_{t=0}$ of the voltage Vcd. For example, the parameter calculator 5B sets n (n is an integer of two or more) initial values $\text{Vcd}|_{t=0}$ of the voltage Vcd different from each other, and calculates n data combinations each including the equivalent capacitor Cd, the equivalent inductor Ld and the equivalent resistor Rd.

Provided that the value (initial value) $\text{Vcd}|_{t=0}$ of the voltage Vcd at time point t=0 when the switch SW is turned on is "Vmax", the parameter calculator 5B sets the value (initial value) $\text{Vcd}|_{t=0}$ of the voltage Vcd to multiple different values by increasing and decreasing Vmax at a predetermined rate (hereinafter also called a "correction factor"), for example.

Here, "Vmax" may be, for example, the measured value of the voltage Vcd at time point t=0, or the maximum value of the smoothed waveform obtained by smoothing the measured value of the voltage Vcd.

The correction factor is as follows. For example, when n=5, the parameter calculator 5B may change $\text{Vcd}|_{t=0}$ from −20% to +20% by every 10%, and set five initial values $\text{Vcd}|_{t=0}$. That is, the parameter calculator 5B may set five initial values $\text{Vcd}|_{t=0}$, i.e., "Vmax×(1.00−0.20)", "Vmax×(1.00−0.10)", "Vmax×1.00", "Vmax×(1.00+0.10)" and "Vmax×(1.00+0.20)".

Note that the initial values $\text{Vcd}|_{t=0}$ may be set to freely selected values different from each other. The values are not necessarily limited to the example described above. For example, the correction factor is not necessarily changed at a predetermined interval (every 10%). The number of set initial values $\text{Vcd}|_{t=0}$ is not limited to "5". The correction factor of Vmax is not limited to what is from −20% to +20% described above.

The parameter calculator 5B calculates the value of the equivalent capacitor Cd, the value of the equivalent inductor Ld and the value of the equivalent resistor Rd for each of the set n (n is an integer of two or more) initial values $\text{Vcd}|_{t=0}$ of the voltage Vcd, according to a method similar to that of the parameter calculator 5A according to Embodiment 2, and stores n pieces of analysis result information (data combinations) 83B_1 to 83B_n in the memory 8.

In the example described above, the parameter calculator 5B calculates the data combinations each including the equivalent capacitor Cd, the equivalent inductor Ld and the equivalent resistor Rd for each of five (n=5) $Vcd|_{t=0}$, and stores the pieces of analysis result information 83B_1 to 83B_5 in the memory 8.

Note that in the following description, when configuration elements having reference signs assigned suffixes, such as the pieces of analysis result information 83B_1 to 83B_n, are not discriminated from each other, the elements are represented by a reference sign with no suffix, such as "analysis result information 83B".

The waveform generator 6 generates the theoretical waveform of the voltage Vcd for every initial value $Vcd|_{t=0}$ of the voltage Vcd. That is, according to a method of similar to that of Embodiments 1 and 2, the waveform generator 6 generates the theoretical waveform for each of the pieces of analysis result information 83B_1 to 83B_n, and stores the waveforms as theoretical waveform data items 85B_1 to 85B_n in the memory 8. In the example described above, the waveform generator 6 generates the theoretical waveform data items 85B_1 to 85B_5 for the respective pieces of analysis result information 83B_1 to 83B_5.

The error calculator 9 calculates an error between the theoretical waveform of the voltage Vcd generated by the waveform generator 6 and the measured waveform of the voltage Vcd measured by the voltage measurement circuit 4. The error calculator 9 calculates the error every $Vcd|_{t=0}$ of the voltage Vcd.

For example, the error calculator 9 calculates the error between the theoretical waveform data 85B_1 and the measured waveform data 84 (e.g., square error) every unit time in the analysis time period Ta, and stores the integrated value of errors as error data 86_1 in the memory 8. Likewise, the error calculator 9 calculates the error between the theoretical waveform data 85B_n and the measured waveform data 84 every unit time, and stores the integrated value of errors as error data 86_n in the memory 8.

The parameter calculator 5B adopts the value of the equivalent capacitor Cd, the value of the equivalent inductor Ld and the value of the equivalent resistor Rd that minimize the error, as analysis results of the winding 11 to be tested. For example, the parameter calculator 5B adopts the data combination having the minimum error among the data combinations (pieces of analysis result information 83B_1 to 83B_n) including the value of the equivalent capacitor Cd, the value of the equivalent inductor Ld and the value of the equivalent resistor Rd calculated every initial value $Vcd|_{t=0}$ of the voltage Vcd, as the analysis result of the winding 11 to be tested. Hereinafter, referring to FIGS. 12 to 15, description is made in detail.

Figure 12:
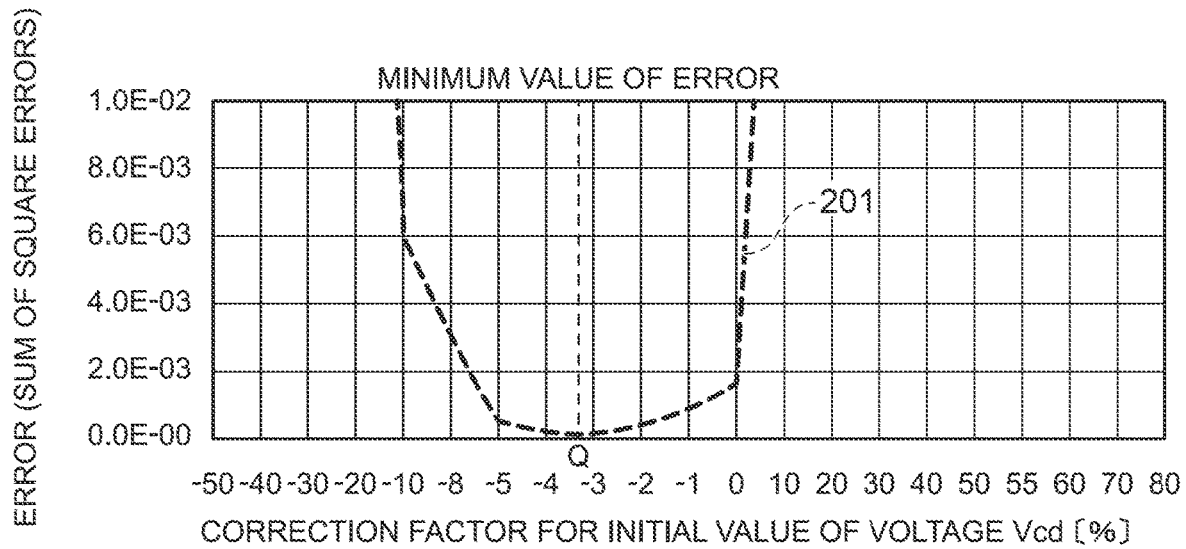
FIG. 12 is a diagram showing an example of an error between a theoretical waveform and a measured waveform at a voltage Vcd when an initial value $Vcd|_{t=0}$ of the voltage Vcd is changed.

FIG. 12 is a diagram showing an example of the error between the theoretical waveform and the measured waveform at the voltage Vcd when the initial value $Vcd|_{t=0}$ of the voltage Vcd is changed.

Figure 13:
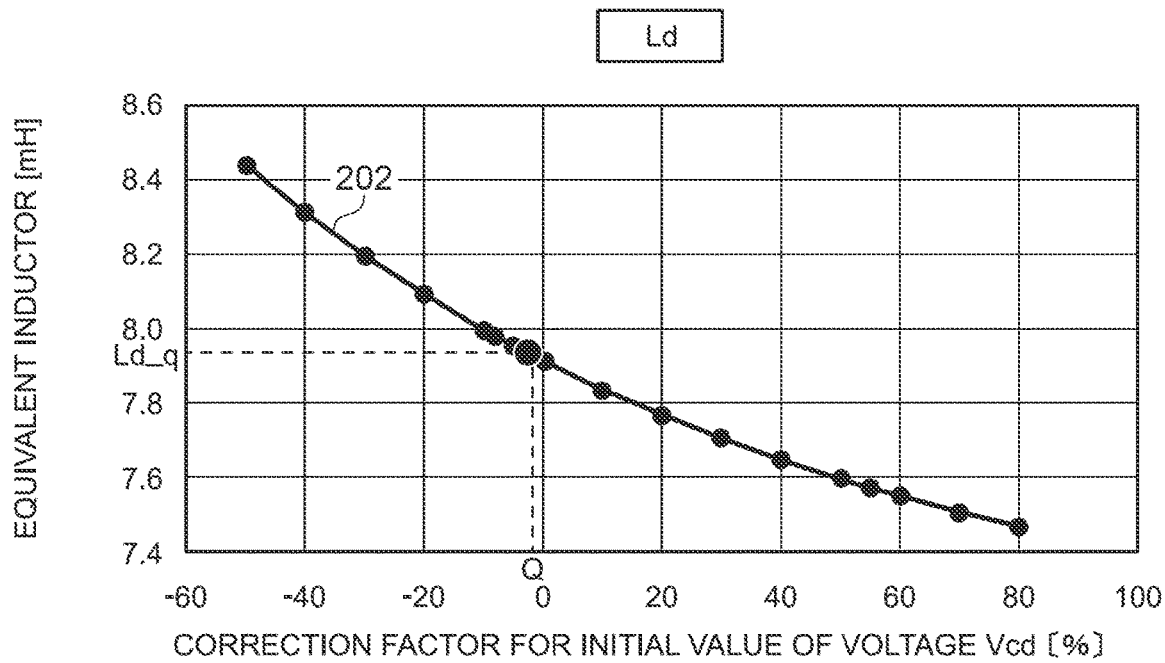
FIG. 13 is a diagram showing an example of an equivalent inductor Ld when the initial value $Vcd|_{t=0}$ of the voltage Vcd is changed.

FIG. 13 is a diagram showing an example of the equivalent inductor Ld when the initial value $Vcd|_{t=0}$ of the voltage Vcd is changed.

Figure 14:
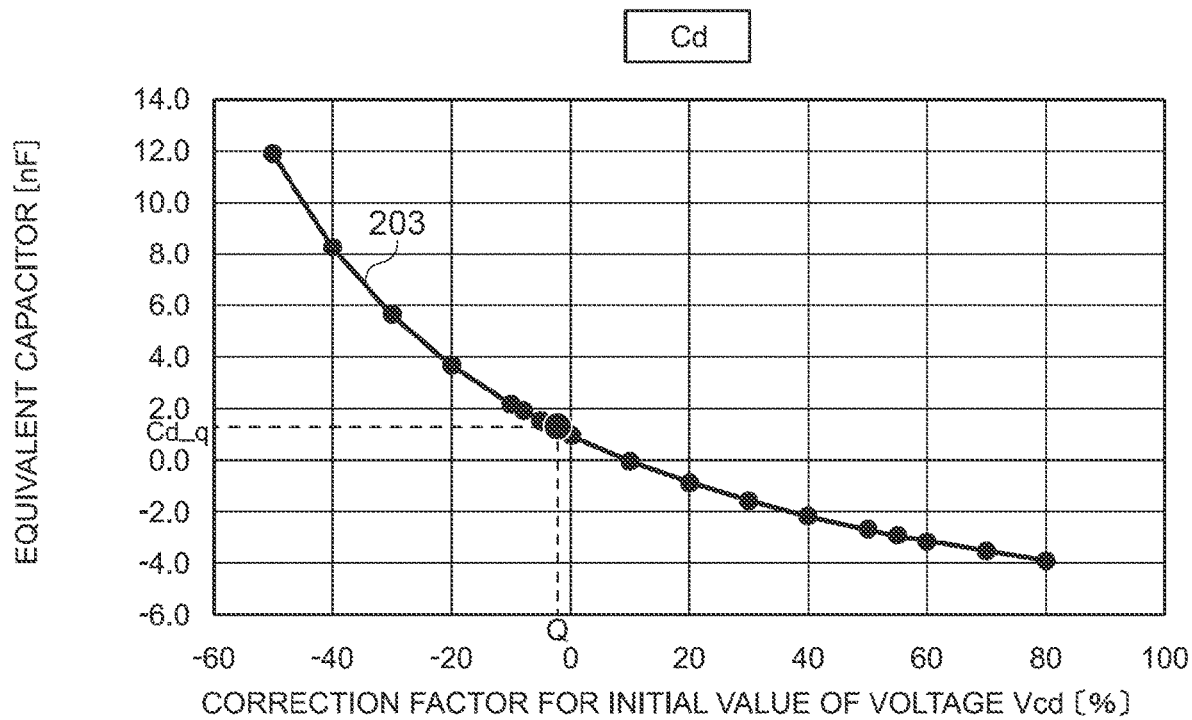
FIG. 14 is a diagram showing an example of an equivalent capacitor Cd when the initial value $Vcd|_{t=0}$ of the voltage Vcd is changed.

FIG. 14 is a diagram showing an example of the equivalent capacitor Cd when the initial value $Vcd|_{t=0}$ of the voltage Vcd is changed.

Figure 15:
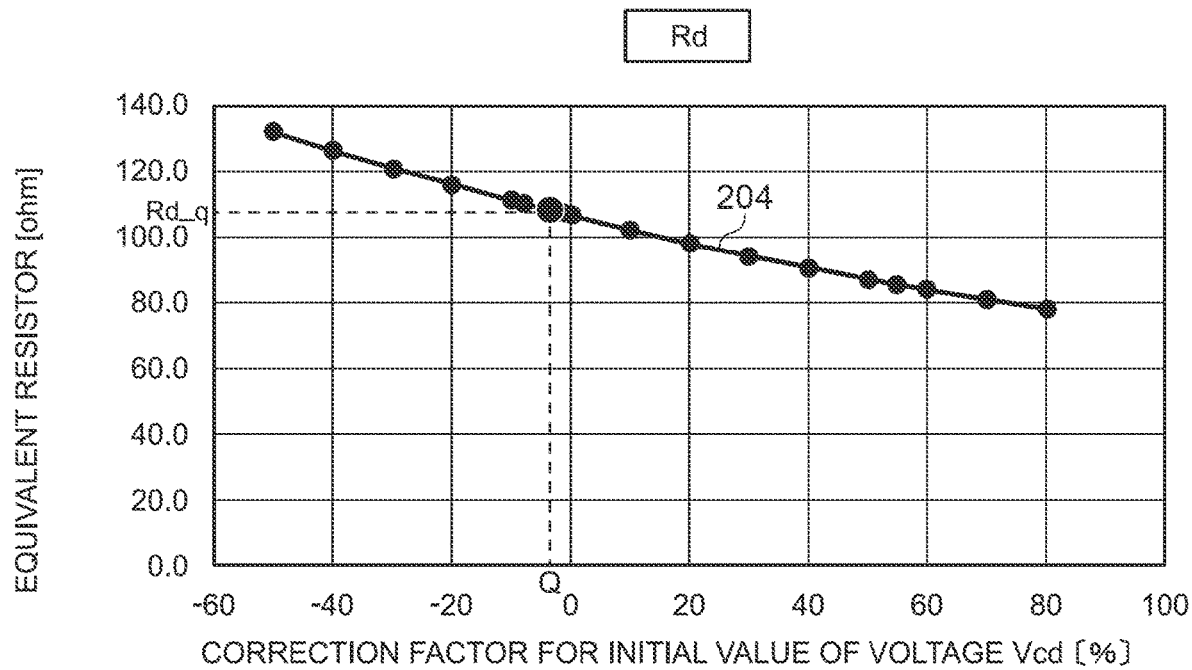
FIG. 15 is a diagram showing an example of an equivalent resistor Rd when the initial value $Vcd|_{t=0}$ of the voltage Vcd is changed.

FIG. 15 is a diagram showing an example of the equivalent resistor Rd when the initial value $Vcd|_{t=0}$ of the voltage Vcd is changed.

In FIGS. 12 to 15, the abscissa axis represents the correction factor [%] of the initial value $Vcd|_{t=0}$ of the voltage Vcd. In FIG. 12, the ordinate axis represents the total value (integrated value) in the analysis time period Ta of the square error between the theoretical waveform and the measured waveform of the voltage Vcd every unit time. In FIG. 13, the ordinate axis represents the equivalent inductor Ld. In FIG. 14, the ordinate axis represents the equivalent capacitor Cd. In FIG. 15, the ordinate axis represents the equivalent resistor Rd.

The graph with reference sign 201 in FIG. 12 assumes the reference value of the initial value $Vcd|_{t=0}$ of the voltage Vcd as "Vmax", and represents the variation in error (total value of square errors) when the reference value is corrected (changed) at a predetermined correction factor (−50% to +80%). The graph with reference sign 202 in FIG. 13 represents the variation in equivalent inductor Ld when the reference value is corrected (changed) at a predetermined correction factor (−50% to +80%). The graph with reference sign 203 in FIG. 14 represents the variation in equivalent capacitor Cd when the reference value is corrected (changed) at a predetermined correction factor (−50% to +80%). The graph with reference sign 204 in FIG. 15 represents the variation in equivalent resistor Rd when the reference value is corrected (changed) at a predetermined correction factor (−50% to +80%).

According to the graph with reference sign 201 in FIG. 12, it is shown that the error is minimized at the initial value $Vcd|_{t=0}$ of the voltage Vcd with the correction factor of about "−3.3%".

Provided that the point (error minimum point) minimizing the error is "Q", the parameter calculator 5B adopts the data combinations (analysis result information 83B) including the value of the equivalent capacitor Cd, the value of the equivalent inductor Ld and the value of the equivalent resistor Rd at the error minimum point Q, as the analysis result of the winding 11 to be tested.

In the example described above, the parameter calculator 5B adopts the analysis result information 83B including the value Ld_q of the equivalent inductor Ld in FIG. 13, the value Cd_q of the equivalent capacitor Cd in FIG. 14, and the value Rd_q of the equivalent resistor Rd in FIG. 15, as the analysis result of the winding 11 to be tested. As described above, the analysis result information 83 selected by the parameter calculator 5B is displayed as information on the analysis result of the winding 11 to be tested, on the display 70 of the display 7, for example.

Note that the display 7 may display at least one of the graphs (201 to 204) shown in FIGS. 13 to 15 on the display 70.

Thereafter, a flow of a method of analyzing the winding 11 to be tested using the testing instrument 1B according to Embodiment 3 is described.

Figure 16:
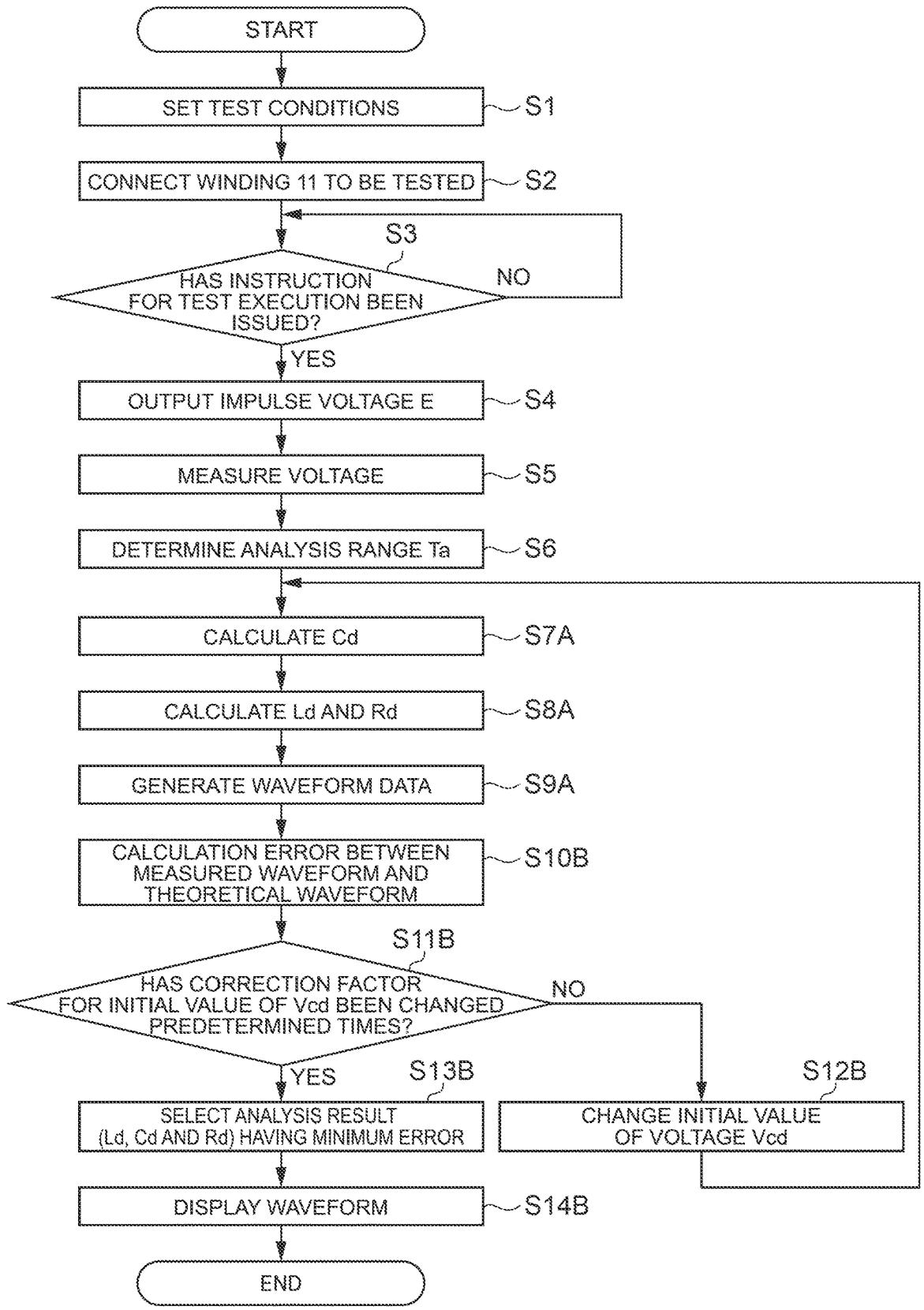
FIG. 16 is a flowchart showing a flow of a method of analyzing a winding using the testing instrument according to Embodiment 3.

FIG. 16 is a flowchart showing a flow of a method of analyzing the winding 11 using the testing instrument 1B according to Embodiment 3.

In the flowchart shown in FIG. 16, processes from step S1 to step S9A are similar to those in the flowchart (FIG. 10) according to Embodiment 2.

After step S9A, the error calculator 9 calculates the error between the theoretical waveform data 85 and the measured waveform data 84 when the initial value $Vcd|_{t=0}$ of the voltage Vcd generated in step S9A is "Vmax", according to the method described above, and stores the error as error data 86 in the memory 8 (step S10B).

Thereafter, the parameter calculator 5B determines whether the processes (steps S8A to S10B) of changing the correction factor for the initial value $Vcd|_{t=0}$ of the voltage Vcd, calculating the equivalent capacitor Cd, the equivalent inductor Ld and the equivalent resistor Rd, and calculating the error between the measured waveform and the theoretical waveform have been executed predetermined times or not (step S11B). Here, the predetermined times, i.e., the number of changes of the correction factor may be preset in the memory 8, or set by the user operating the testing instrument 1B before the analysis of the winding 11 is executed.

When the processes described above (steps S8A to S10B) have not been executed the predetermined times yet (step S11B: NO), the parameter calculator 5B changes the initial value $Vcd|_{t=0}$ of the voltage Vcd depending on the correction factor according to the method described above (step S12B). Thereafter, the parameter calculator 5B, the waveform generator 6 and the error calculator 9 execute steps S8A to S10B described above, using the initial value $Vcd|_{t=0}$ of the voltage Vcd changed in step S12B.

When the processes described above (steps S8A to S10B) have been executed the predetermined times (step S11B: YES), the parameter calculator 5B selects the piece of analysis result information 83 having the minimum error from among the pieces of analysis result information 83B_1 to 83B_n each having the equivalent capacitor Cd, the equivalent inductor Ld and the equivalent resistor Rd calculated with the initial value $Vcd|_{t=0}$ of the voltage Vcd being changed, according to the method described above, as the analysis result of the winding 11 to be tested (step S13B).

Thereafter, the display 7 displays information pertaining to the analysis result information 83 selected by the parameter calculator 5B in step S13 (step S14B). For example, the display 7 may display, on the screen of the display 70, the values of the equivalent capacitor Cd, the equivalent inductor Ld and the equivalent resistor Rd included in the analysis result information 83 selected by the parameter calculator 5B in step S13.

For example, similar to the testing instrument 1 according to Embodiment 1, the display 7 may display, on the display 70, both the theoretical waveform and the measured waveform based on the analysis result information 83 selected by the parameter calculator 5B in step S13. The display 7 may display at least one of the graphs assigned reference signs 201 to 204 shown in FIGS. 12 to 15 on the display 70.

Note that similar to the testing instrument 1 according to Embodiment 1, the information displayed by the display 7 in step S14B may be information designated by the user through the instruction input interface 3.

As described above, in the testing instrument 1B according to Embodiment 3, the parameter calculator 5B changes the initial value $Vcd|_{t=0}$ of the voltage Vcd to multiple values different from each other, and calculates the value of the equivalent capacitor Cd, the value of the equivalent inductor Ld and the value of the equivalent resistor Rd every changed initial value $Vcd|_{t=0}$ of the voltage Vcd. The error calculator 9 calculates the error between the theoretical waveform of the voltage Vcd and the measured waveform of the voltage Vcd every changed initial value $Vcd|_{t=0}$ of the voltage Vcd. The parameter calculator 5B adopts the data combination having the minimum error among the data combinations (pieces of analysis result information 83B_1 to 83B_n) including the value of the equivalent capacitor Cd, the value of the equivalent inductor Ld and the value of the equivalent resistor Rd calculated every initial value $Vcd|_{t=0}$ of the voltage Vcd, as the analysis result of the winding 11 to be tested.

Accordingly, even when parameters (data combinations) pertaining to the winding 11 to be tested by simpler regression analysis than that in the conventional art are calculated, the data combination having a theoretical waveform closest to the measured waveform of the voltage Vcd is retrieved, thus allowing the winding 11 to be analyzed more accurately.

The method of calculating the analysis result is not limited to the example described above. For example, as for the error data items 86_1 to 86_n, the correction factor is on the abscissa axis, and the error and Cd, Ld and Rd are on the ordinate axis, and approximate quadratic curves of plotted points are respectively obtained. Thereafter, the correction factor having the minimum value of error on the approximate quadratic curves is obtained. The correction factor having the minimum value of error is substituted in the approximate quadratic curves of Cd, Ld and Rd, and the values of Cd, Ld and Rd respectively obtained by the substitution may be adopted as the analysis results. Alternatively, the approximate value of the correction factor having the minimum value of error may be obtained by a known recursive algorithm, and the analysis result may be obtained from the approximate value of the correction factor in a manner similar to that of the above description.

Extended Embodiment

The disclosure made by the inventor of the present application has been specifically described above based on the embodiments. However, it is a matter of course that the present disclosure is given no specific limitation, and can be variously changed in a range without departing from the gist of the disclosure.

For example, in the embodiment described above, the case where the testing instrument 1 includes the back flow preventing diode D is exemplified. Alternatively, the testing instrument 1 does not necessarily include the back flow preventing diode D.

In Embodiments 2 and 3, the case where the timing when the switch SW is turned on is adopted as time t=0 in the analysis time period Ta is exemplified. No limitation to this case resides. For example, in a case of using, for regression analysis, time-series data obtained by a smoothing process using a moving average window applied to time-series data on measured values of the voltage Vcd by the voltage measurement circuit 4, a time point at which the smoothed waveform rises is sometimes different from a time point at which the switch SW is turned on. A time point at which the smoothed waveform reaches the maximum value is sometimes different from a time point at which the switch SW is turned on.

In such cases, for example, an operation with interpolation from the time point at which the smoothed waveform rises to the time point at which the smoothed waveform reaches the maximum value may be performed so that the smoothed waveform is Vcd obtained by adding the correction factor to the time point when the switch SW is turned on.

Each flowchart described above indicates an example for illustrating the operation. No specific limitation is given. That is, steps indicated in each of the diagrams of the flowcharts are specific examples. No specific limitation to the flowchart is given. For example, the order of some processes may be changed. Another process may be inserted between processes. Some processes may be performed in parallel.

What is claimed is:

1. A testing instrument, comprising:
a first external terminal to which one terminal of a winding to be tested is connected, and a second external terminal to which another terminal of the winding is connected;
an impulse voltage application capacitor having one end connected to the second external terminal;
a switch connected between another end of the impulse voltage application capacitor and the first external terminal;
a current limiting resistor connected between the other end of the impulse voltage application capacitor and the first external terminal in series with the switch;
an instruction input interface configured to accept an instruction for starting a test;
a voltage measurement circuit configured to measure a voltage between the first external terminal and the second external terminal;
a memory configured to store measured value information including a measured value of the voltage measured by the voltage measurement circuit; and
a parameter calculator configured to calculate at least one of a value of an equivalent inductor connected between the first external terminal and the second external terminal, a value of an equivalent capacitor connected between the first external terminal and the second external terminal, and a value of an equivalent resistor connected between the first external terminal and the second external terminal in series with the equivalent inductor, based on the measured value information stored in the memory, when the winding is equivalently represented by the equivalent inductor, the equivalent capacitor, and the equivalent resistor,
wherein the instruction input interface turns on the switch according to the instruction for starting the test,
the parameter calculator calculates coefficients of an equation of a transient response of the voltage in an equivalent circuit that includes the equivalent inductor, the equivalent capacitor and the equivalent resistor, and the impulse voltage application capacitor and the current limiting resistor by performing regression analysis using the measured value of the voltage in a predetermined time period from turning on of the switch to start of resonance, and the parameter calculator calculates at least one of the value of the equivalent capacitor, the value of the equivalent inductor, and the value of the equivalent resistor, based on the calculated coefficients.

2. The testing instrument according to claim 1, further comprising
a rectifier element configured to be connected between the other end of the impulse voltage application capacitor and the first external terminal in series with the switch and the current limiting resistor, allow current to pass from the impulse voltage application capacitor's side to the first external terminal's side, and block current from the first external terminal's side to the impulse voltage application capacitor's side.

3. The testing instrument according to claim 1, wherein the parameter calculator detects a maximum point at which the voltage is maximized after the switch is turned on, and a minimum point at which the voltage is minimized, and adopts a time period between the maximum point and the minimum point as the predetermined time period.

4. The testing instrument according to claim 1, wherein the equation of the transient response is an expression obtained by integrating a differential equation representing a temporal variation in the voltage in the equivalent circuit, multiple times with respect to time.

5. The testing instrument according to claim 4, wherein the equation of the transient response is an expression obtained by integrating the differential equation three times with respect to time, and
provided that the value of the equivalent inductor is Ld, the value of the equivalent capacitor is Cd, the value of the equivalent resistor is Rd, a value of the impulse voltage application capacitor is Cs, a value of the current limiting resistor is Rs, the voltage between the first external terminal and the second external terminal is Vcd, and the time is t, the expression obtained by three time integrations is represented by a following expression (1).

[Expression 1]

$$-\frac{Rs \cdot Cd}{E} Vcd - \frac{Cs \cdot Ld + Cd \cdot Ld + Cs \cdot Rs \cdot Cd \cdot Rd}{Cs \cdot Ld \cdot E} \int Vcd\,dt - \frac{Cs \cdot Rs + Cs \cdot Rd + Cd \cdot Rd}{Cs \cdot Ld \cdot E} \int\int Vcd\,dt\,dt - \frac{1}{Cs \cdot Ld \cdot E} \int\int\int Vcd\,dt\,dt\,dt + \frac{Rd}{Ld}\frac{1}{2}t^2 + t = 0 \quad (1)$$

6. The testing instrument according to claim 4, wherein the equation of the transient response is an expression obtained by integrating the differential equation twice with respect to time, and
provided that the value of the equivalent inductor is Ld, the value of the equivalent capacitor is Cd, the value of the equivalent resistor is Rd, a value of the impulse voltage application capacitor is Cs, a value of the current limiting resistor is Rs, the voltage between the first external terminal and the second external terminal is Vcd, and the time is t, the expression obtained by two time integrations is represented by a following expression (2).

[Expression 2]

$$-\frac{Rs \cdot Cd}{E}\frac{dVcd}{dt} - \frac{Cs \cdot Ld + Cd \cdot Ld + Cs \cdot Rs \cdot Cd \cdot Rd}{Cs \cdot Ld \cdot E} Vcd - \frac{Cs \cdot Rs + Cs \cdot Rd + Cd \cdot Rd}{Cs \cdot Ld \cdot E} \int Vcd\,dt - \frac{1}{Cs \cdot Ld \cdot E} \int\int Vcd\,dt\,dt + \frac{Rd}{Ld}t + 1 = 0 \quad (2)$$

7. The testing instrument according to claim 1, further comprising:
a waveform generator configured to generate a theoretical waveform of the voltage by performing numerical integration using the equation of the transient response to which the value of the equivalent capacitor, the value of the equivalent inductor and the value of the equivalent resistor calculated by the parameter calculator have been applied, and
a display configured to display the theoretical waveform generated by the waveform generator and the measured waveform of the voltage measured by the voltage measurement circuit.

8. The testing instrument according to claim 1, wherein the parameter calculator calculates the value of the equivalent capacitor, based on an equation indicating a relationship between the impulse voltage application capacitor and the equivalent capacitor and on the measured value information stored in the memory, the equation assuming that an initial value of the voltage in the predetermined time period coincides with a voltage obtained by dividing a charge voltage of the impulse voltage application capacitor between the impulse voltage application capacitor and the equivalent capacitor, and the parameter calculator calculates the value of the equivalent inductor and the value of the equivalent resistor, based on the initial value of the voltage.

9. The testing instrument according to claim 8, further comprising:
a waveform generator configured to generate a theoretical waveform of the voltage by performing numerical integration using the equation of the transient response to which the value of the equivalent capacitor, the value of the equivalent inductor and the value of the equivalent resistor calculated by the parameter calculator have been applied; and
an error calculator configured to calculate an error between the theoretical waveform generated by the waveform generator and the measured waveform of the voltage measured by the voltage measurement circuit,
wherein the parameter calculator adopts the value of the equivalent capacitor, the value of the equivalent inductor and the value of the equivalent resistor that minimize the error, as analysis results of the winding.

10. The testing instrument according to claim 8, wherein the equation of the transient response is an expression obtained by integrating a differential equation representing a temporal variation in the voltage in the equivalent circuit, with respect to time.

11. The testing instrument according to claim 10, wherein provided that the value of the equivalent inductor is Ld, the value of the equivalent capacitor is Cd, the value of the equivalent resistor is Rd, a value of the impulse voltage application capacitor is Cs, a value of the current limiting resistor is Rs, the voltage between the first external terminal and the second external terminal is Vcd, and the time is t, the equation of the transient response is an expression that is obtained by integrating the differential equation from time t=0 to time t=a (a>0) and is represented by a following expression (21).

$$Cs \cdot Ld \frac{dVcd}{dt}\bigg|_{t=a} + (Cs \cdot Rs + Cs \cdot Rd)Vcd|_{t=a} + \int_0^a Vcd\, dt - Cs \cdot Rd \cdot Vcd|_{t=0} = 0 \quad (21)$$

12. A test method using a testing instrument comprising: a first external terminal to which one terminal of a winding to be tested is connected, and a second external terminal to which another terminal of the winding is connected; an impulse voltage application capacitor having one end connected to the second external terminal; a switch connected between another end of the impulse voltage application capacitor and the first external terminal; and a current limiting resistor connected between the other end of the impulse voltage application capacitor and the first external terminal in series with the switch, the test method including:
a first step of turning on the switch;
a second step of measuring a voltage between the first external terminal and the second external terminal;
a third step of storing measured value information including a measured value of the voltage measured in the second step; and
a fourth step of calculating at least one of a value of an equivalent inductor connected between the first external terminal and the second external terminal, a value of an equivalent capacitor connected between the first external terminal and the second external terminal, and a value of an equivalent resistor connected between the first external terminal and the second external terminal in series with the equivalent inductor, based on the measured value information stored in the third step, when the winding is equivalently represented by the equivalent inductor, the equivalent capacitor, and the equivalent resistor,
wherein the fourth step includes
a step of calculating coefficients of an equation of a transient response of the voltage in an equivalent circuit that includes the equivalent inductor, the equivalent capacitor and the equivalent resistor, the impulse voltage application capacitor, and the current limiting resistor by performing regression analysis using the measured value of the voltage in a predetermined time period from turning on of the switch to start of resonance, and calculating at least one of the value of the equivalent capacitor, the value of the equivalent inductor, and the value of the equivalent resistor, based on the calculated coefficients.

\* \* \* \* \*